(12) United States Patent
Lee et al.

(10) Patent No.: US 10,008,488 B2
(45) Date of Patent: Jun. 26, 2018

(54) SEMICONDUCTOR MODULE ADAPTED TO BE INSERTED INTO CONNECTOR OF EXTERNAL DEVICE

(71) Applicant: Samsung Electronics Co., Ltd., Suwon-si, Gyeonggi-do (KR)

(72) Inventors: Yongkwan Lee, Hwaseong-si (KR); Kundae Yeom, Asan-si (KR); Jongho Lee, Seoul (KR); Hogeon Song, Suwon-si (KR)

(73) Assignee: Samsung Electronics Co., Inc., Gyeonggi-Do (KR)

( * ) Notice: Subject to any disclaimer, the term of this patent is extended or adjusted under 35 U.S.C. 154(b) by 0 days. days.

(21) Appl. No.: 15/489,031

(22) Filed: Apr. 17, 2017

(65) Prior Publication Data

US 2017/0309606 A1    Oct. 26, 2017

(30) Foreign Application Priority Data

Apr. 20, 2016   (KR) .......................... 10-2016-0048377

(51) Int. Cl.
*H01L 25/18*     (2006.01)
*H01L 21/48*     (2006.01)
(Continued)

(52) U.S. Cl.
CPC .......... *H01L 25/18* (2013.01); *H01L 21/4853* (2013.01); *H01L 21/4857* (2013.01); *H01L 23/49816* (2013.01); *H01L 23/49827* (2013.01); *H01L 23/49833* (2013.01); *H01L 23/5384* (2013.01); *H01L 24/16* (2013.01);
(Continued)

(58) Field of Classification Search
CPC ........... G11C 7/00; H01L 21/60; H01L 25/18; H01L 25/5384; H01L 25/105; H01L 25/0652; H01L 24/16; H01L 34/49833; H01L 34/49827; H01L 23/49816; H01L 21/4857; H01L 2224/16141; H01L 21/4853; H01L 25/065; H01L 21/48; H01L 23/498; H01L 23/538; H01L 23/00; H01L 25/10; H05K 3/40; H05K 1/114; H05K 2201/0338; H05K 2201/09727; H05K 2201/09736; H05K 2201/10159; H05K 2201/10189; H05K 3/366; H05K 3/421
USPC ........ 257/737, 738, 723, 777, 68, 685, 778, 257/774, 686, 773
See application file for complete search history.

(56) References Cited

U.S. PATENT DOCUMENTS 6,301,121 B1   10/2001   Lin
6,835,580 B1   12/2004   Knapp et al.
(Continued)

FOREIGN PATENT DOCUMENTS

KR   20130082344 A   7/2013
KR   20130088911 A   8/2013
(Continued)

*Primary Examiner* — Alexander Oscar Williams
(74) *Attorney, Agent, or Firm* — Harness, Dickey & Pierce, P.L.C.

(57) ABSTRACT

In one embodiment, the semiconductor module includes a module substrate and a first substrate mounted on and electrically connected to a first surface of the module substrate. The first substrate has one or more first electrical connectors of the semiconductor module, and the first substrate electrically connecting the first electrical connector to the module substrate.

19 Claims, 22 Drawing Sheets

(51) Int. Cl.
*H01L 23/00* (2006.01)
*H01L 23/498* (2006.01)
*H01L 23/538* (2006.01)
*H01L 25/065* (2006.01)
*H01L 25/10* (2006.01)

(52) U.S. Cl.
CPC ........ *H01L 25/0652* (2013.01); *H01L 25/105* (2013.01); *H01L 2224/16141* (2013.01)

(56) References Cited

U.S. PATENT DOCUMENTS

| | | | |
|---|---|---|---|
| 7,326,857 B2 | 2/2008 | Germann et al. | |
| 7,471,260 B2 * | 12/2008 | Ochi | H01L 23/49855 257/E23.064 |
| 7,999,197 B1 | 8/2011 | Sawyer et al. | |
| 9,320,147 B2 | 4/2016 | Cho et al. | |
| 2004/0008495 A1 | 1/2004 | Ho | |
| 2004/0070959 A1 | 4/2004 | Sakai | |
| 2009/0057918 A1 * | 3/2009 | Kim | H01L 25/0657 257/777 |
| 2010/0061056 A1 | 3/2010 | Searls et al. | |
| 2010/0072593 A1 * | 3/2010 | Kim | H01L 21/563 257/676 |
| 2010/0096754 A1 * | 4/2010 | Lee | H01L 21/568 257/738 |
| 2012/0091580 A1 * | 4/2012 | Jeong | H01L 21/76898 257/737 |
| 2012/0112359 A1 * | 5/2012 | Jeong | H01L 23/481 257/774 |
| 2012/0214302 A1 * | 8/2012 | Jeong | H01L 21/76898 438/613 |
| 2013/0020720 A1 * | 1/2013 | Kim | H01L 23/3135 257/774 |
| 2013/0147063 A1 * | 6/2013 | Park | H01L 21/568 257/777 |
| 2013/0175496 A1 | 7/2013 | Choi | |
| 2013/0223001 A1 | 8/2013 | Ryu et al. | |
| 2016/0351729 A1 * | 12/2016 | Ishibashi | H01L 23/66 |

FOREIGN PATENT DOCUMENTS

| | | |
|---|---|---|
| KR | 20130097481 A | 9/2013 |
| KR | 101320929 B1 | 10/2013 |
| KR | 10-1450067 B1 | 10/2014 |

* cited by examiner

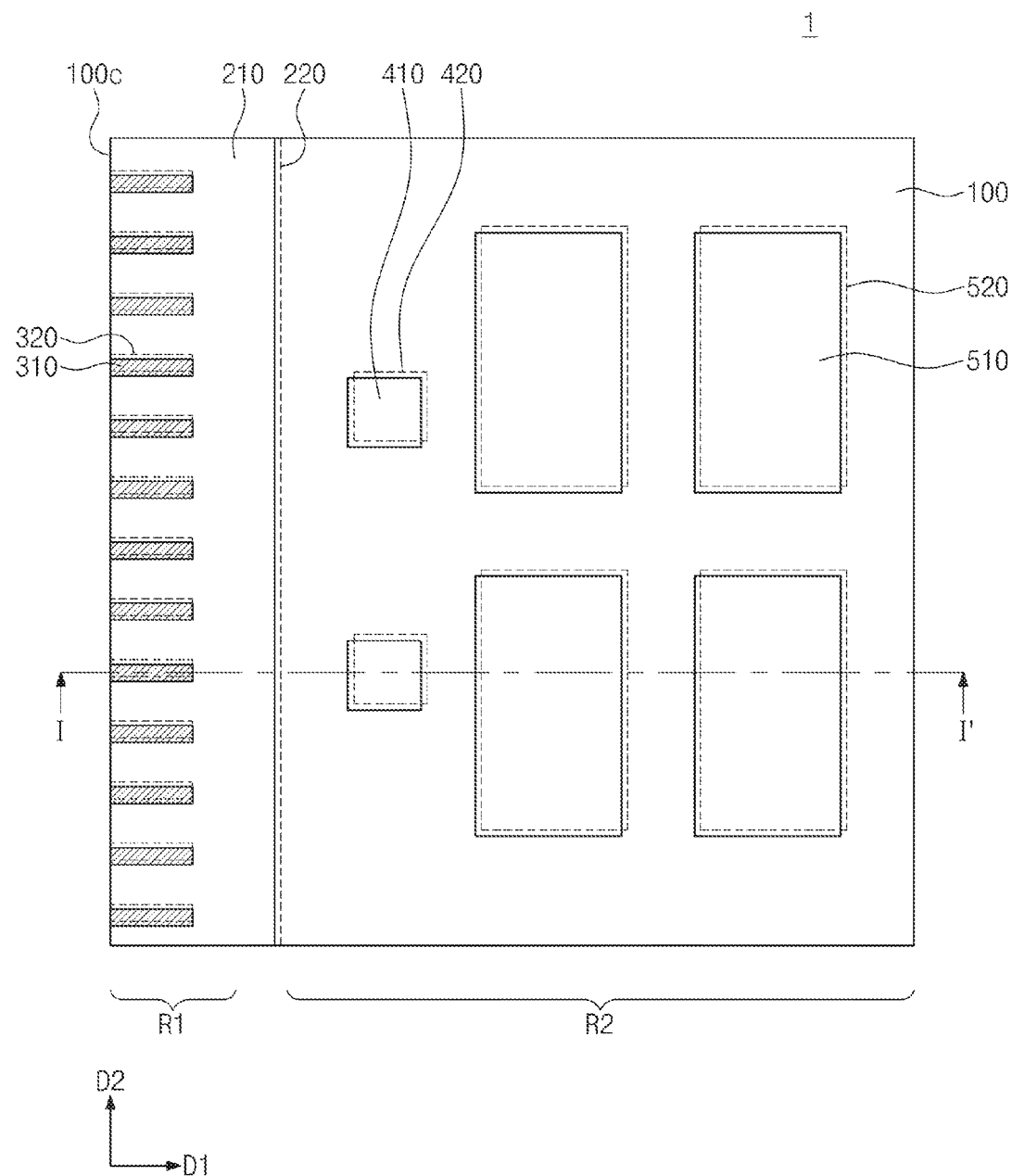

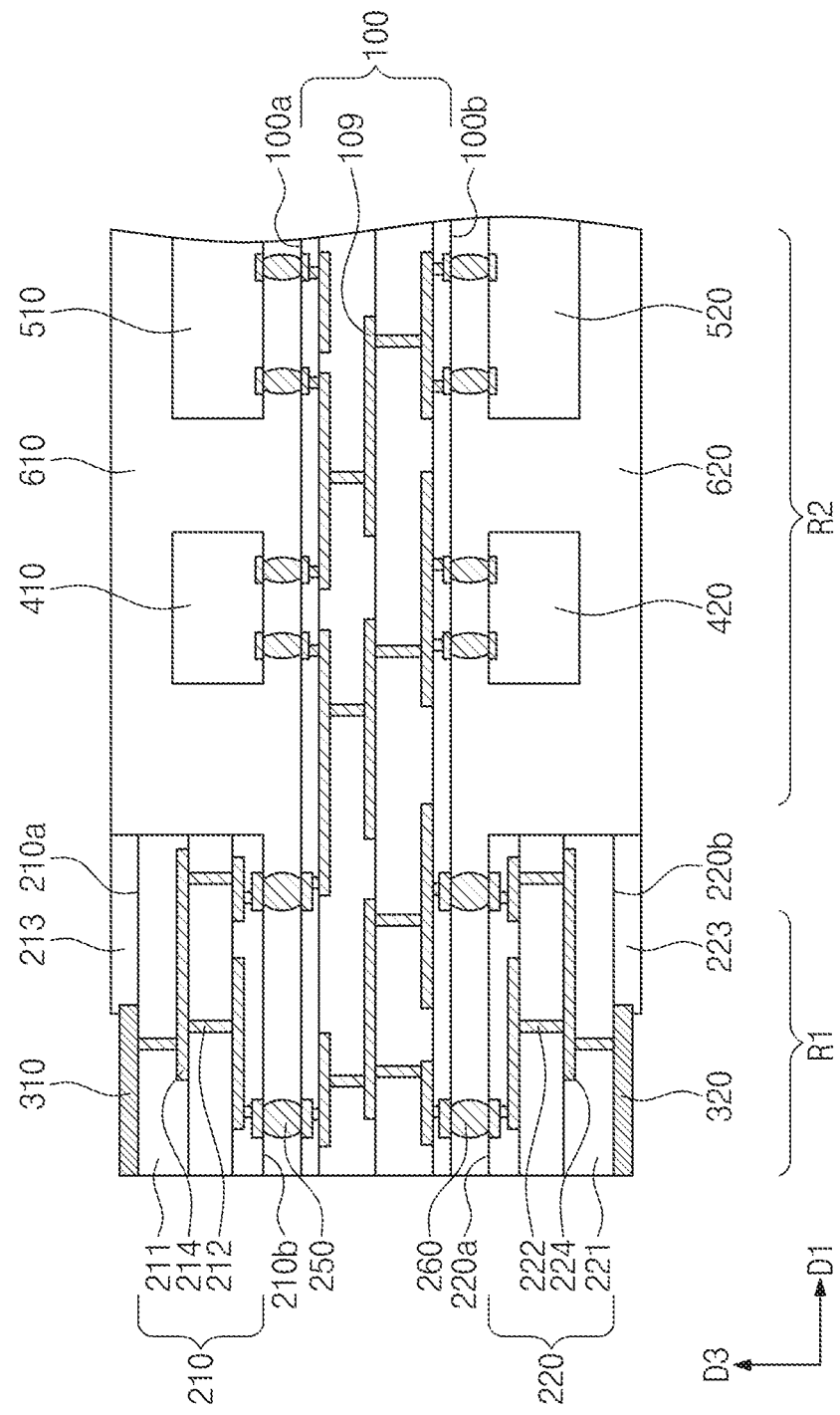

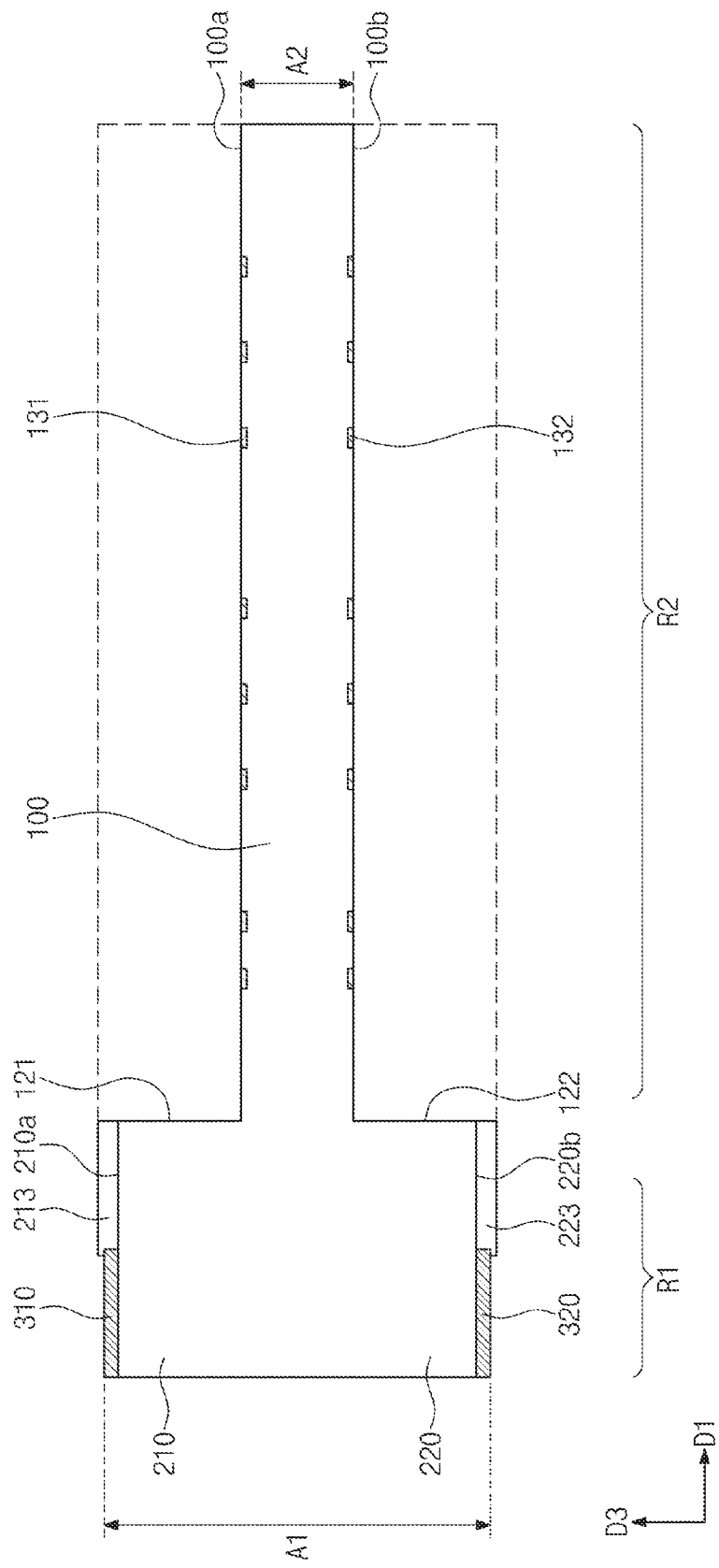

SEMICONDUCTOR MODULE ADAPTED TO BE INSERTED INTO CONNECTOR OF EXTERNAL DEVICE

CROSS-REFERENCE TO RELATED APPLICATIONS

This U.S. non-provisional patent application claims priority under 35 U.S.C. § 119 to Korean Patent Application No. 10-2016-0048377, filed on Apr. 20, 2016, in the Korean Intellectual Property Office, the entire contents of which are hereby incorporated by reference.

BACKGROUND OF THE INVENTION

The present disclosure relates to a semiconductor module, and in particular, to a module substrate and a semiconductor module therewith.

Recently, there is an increasing demand for electronic devices (e.g., cellular phones and notebook computers) with a light weight and a small size. To meet such a demand, a size and a weight of a semiconductor module to be provided in the electronic device are reduced. The semiconductor module may be inserted into a connector of an electronic device. Accordingly, the semiconductor module is manufactured to meet the international standard in terms of shape and size (e.g., thickness or width).

SUMMARY

Some embodiments of the inventive concepts provide a small-sized semiconductor module and a module substrate including the same.

At least one embodiment relates to a semiconductor module.

In one embodiment, the semiconductor module includes a module substrate and a first substrate mounted on and electrically connected to a first surface of the module substrate. The first substrate has one or more first electrical connectors of the semiconductor module, and the first substrate electrically connecting the first electrical connector to the module substrate.

In one embodiment, the semiconductor module includes a main substrate. A connection substrate and at least one chip are mounted on a first surface of the main substrate. The connection substrate is electrically connected to the chip via the main substrate, and the connection substrate includes one or more taps for electrically connecting the semiconductor module to an external device.

At least one embodiment relates to a system.

In one embodiment, the system includes a module substrate having a connecting region and a system region. The module substrate has a first surface and a second surface, and the second surface is opposite the first surface. A first substrate is mounted on and electrically connected to the first surface of the module substrate in the connecting region. The first substrate has one or more first electrical connectors, and the first substrate electrically connects the first electrical connector to the module substrate. At least one first system structure is mounted on the first surface of the module substrate in the system region.

One embodiment relates to a method of manufacturing a semiconductor module.

In one embodiment, the method includes mounting a first substrate on a first surface of a module substrate in a first region of the module substrate. The first substrate includes at least one first electrical connector for the semiconductor module on an outer surface thereof. The method further includes mounting a first device structure on the first surface of the module substrate in a second region of the module substrate. The module substrate electrically connects the first substrate to the first device structure. The module further includes forming a first mold layer over the first surface of the module substrate to cover the first device structure and a portion of the first substrate such that the first electrical connector remains exposed.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 1A is a plan view illustrating a semiconductor module according to an embodiment of the inventive concepts.

FIG. 1D is an enlarged sectional view illustrating an electric connection between the taps and the module substrate, according to an embodiment of the inventive concepts.

FIGS. 9A and 9B are sectional views illustrating a process of forming a semiconductor module, according to an embodiment of the inventive concepts.

DETAILED DESCRIPTION

It will be understood that when an element is referred to as being "connected" or "coupled" to another element, it may be directly connected or coupled to the other element or intervening elements may be present.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Figure 1B:
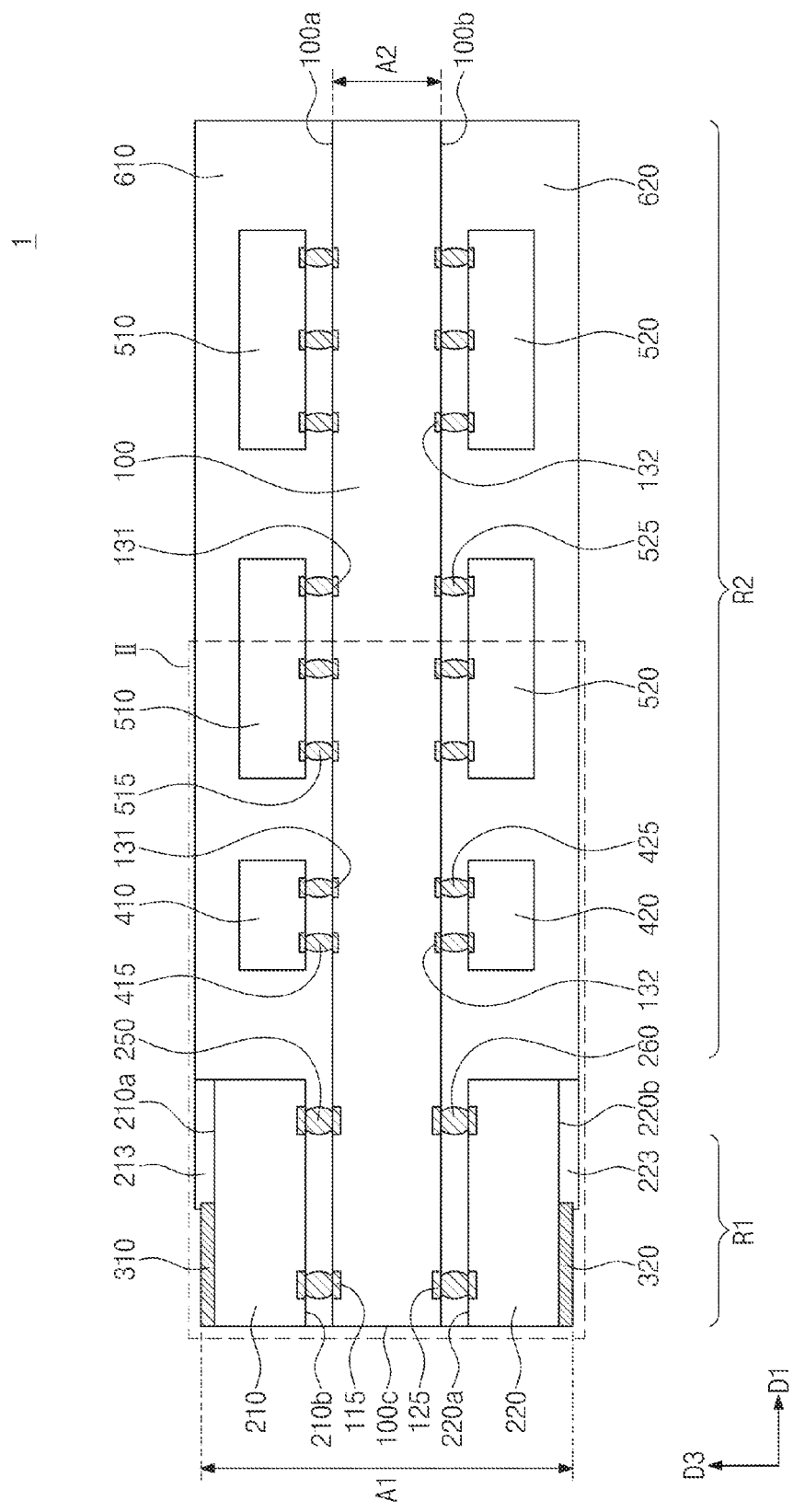
FIG. 1B is a sectional view taken along line I-I' of FIG. 1A.
Figure 1C:
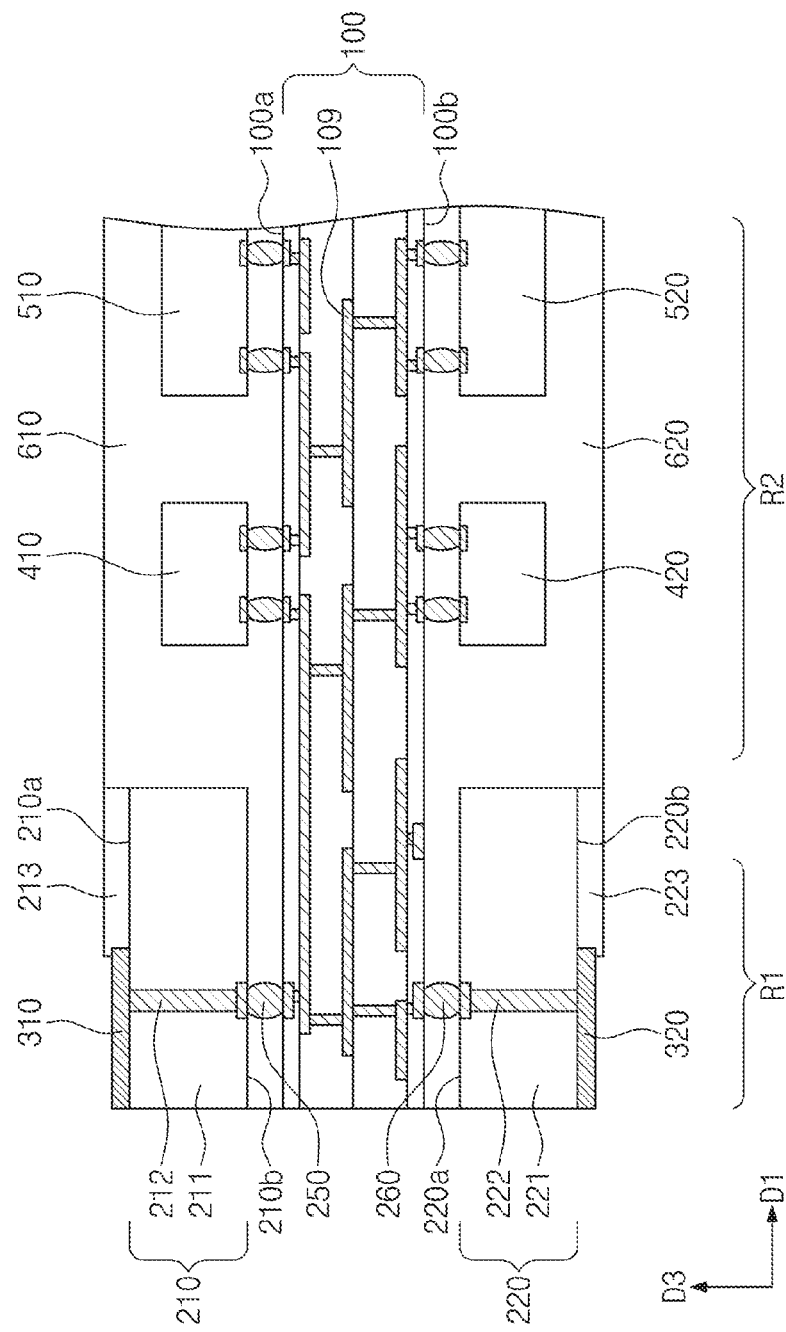
FIG. 1C is an enlarged sectional view illustrating a portion 'II' of FIG. 1B.

FIG. 1A is a plan view illustrating a semiconductor module according to an embodiment of the inventive concepts. FIG. 1B is a sectional view taken along line I-I' of FIG. 1A. FIG. 1C is an enlarged sectional view illustrating a portion a portion 'II' of FIG. 1B.

Referring to FIGS. 1A and 1B, a semiconductor module 1 may include a module substrate 100, a first substrate 210, a second substrate 220, a first electronic component 410, a second electronic component 420, one or more first semiconductor chips 510, one or more second semiconductor chips 520, a first mold layer 610, and a second mold layer 620. The module substrate 100 may include a first region R1 and a second region R2. The first region R1 of the module substrate 100 may be adjacent to a side 100c of the module substrate 100. The module substrate 100 may have a first surface 100a and a second surface 100b facing away from each other (e.g., oppositely facing). As shown in FIG. 1B, the side 100c of the module substrate 100 may be perpendicular to the first surface 100a and the second surface 100b. As shown in FIG. 1A, when viewed in a plan view, the side 100c of the module substrate 100 may extend parallel to a second direction D2. In the specification, first and second directions D1 and D2 may be parallel to the first surface 100a of the module substrate 100 and may be not parallel to each other. The module substrate 100 may be a printed circuit board (PCB) provided with circuit patterns. The module substrate 100 may have a thickness A2 that is substantially uniform. Here, the thickness A2 of the module substrate 100 may refer to a distance between the first and second surfaces 100a and 100b. As shown in FIG. 1B, one or more first connection pads 131 and one or more second connection pads 132 may be provided on the second region R2 of the module substrate 100. The first connection pads 131 and the second connection pads 132 may be disposed on the first surface 100a and the second surface 100b, respectively.

The first substrate 210 may be mounted on the first region R1 of the first surface 100a of the module substrate 100. When viewed in a plan view, the first substrate 210 may have a longitudinal axis parallel to the second direction D2. The first substrate 210 may be a printed circuit board (PCB). One or more first connecting portions 250 may be provided between the module substrate 100 and the first substrate 210. The first connecting portion 250 may be coupled to an upper pad 115 on the module substrate 100 and a pad on the first substrate 210. The first connecting portion 250 may be provided in the form of a bump or a solder ball. The first substrate 210 may have two opposite surfaces (e.g., a bottom surface 210b and a top surface 210a). Here, the first substrate 210 may be provided in such a way that the bottom surface 210b faces the module substrate 100. The top surface 210a of the first substrate 210 may be positioned at a higher level than that of the first surface 100a of the second region R2 of the module substrate 100.

A first tap 310 may be disposed on the top surface 210a of the first substrate 210. The first tap 310 may be adjacent to the side 100c of the module substrate 100. In some embodiments, as shown in FIG. 1A, a plurality of first taps 310 may be disposed on the top surface 210a of the first substrate 210. The first taps 310 may be arranged in the second direction D2 to form a column parallel to the second direction D2. Each of the first taps 310 may have a longitudinal axis parallel to the first direction D1, when viewed in a plan view. The first taps 310 may be formed of or include at least one metal (e.g., copper or aluminum). In certain embodiments, each of the first taps 310 may be a portion of the circuit pattern of the first substrate 210 exposed by a first passivation layer 213.

The first electronic component 410 may be mounted on the first surface 100a of the second region R2 of the module substrate 100. The first electronic component 410 may be spaced apart from the first substrate 210 in the first direction D1. The first electronic component 410 may include a capacitor, a resistor, or an inductor. A first interposer 415 may be interposed between the module substrate 100 and the first electronic component 410, and may be coupled to the first connection pad 131 and a connection pad of the first electronic component 410. The first interposer 415 may be provided in the form of a solder, solder ball, or a bump, but the inventive concepts are not be limited thereto.

The first semiconductor chips 510 may be mounted on the first surface 100a of the second region R2 of the module substrate 100 and may be spaced apart from the first substrate 210 in the first direction D1. In some embodiments, the first semiconductor chips 510 may include a memory device (e.g., at least one of DRAM, NAND Flash, NOR Flash, OneNAND, PRAM, ReRAM, or MRAM devices). In certain embodiments, the first semiconductor chips 510 may include a logic device (e.g., a photoelectronic device, a communication device, a digital signal processor, a controller, or a system-on-chip). In certain embodiments, the first semiconductor chips 510 may include a memory device and a logic device. For the purposes of simplifying the description, connection of a single first semiconductor chip 510 will be described. One or more first terminals 515 may be interposed between the module substrate 100 and the first semiconductor chip 510 and may be coupled to respective first connection pads 131 and respective connection pads at the first semiconductor chip 510. The first terminal 515 may be provided in the form of a solder or a bump. Although not illustrated, the first terminal 515 may be a bonding wire disposed on a top surface of the first semiconductor chip 510.

The first mold layer 610 may be provided on the first surface 100a of the module substrate 100 to cover the first electronic component 410 and the first semiconductor chip 510. For example, the first mold layer 610 may include an insulating polymer (e.g., epoxy molding compound). The first mold layer 610 may extend into a gap between the module substrate 100 and the first substrate 210 to hermetically cover the first connecting portion 250. The first mold layer 610 may be configured to reduce or prevent the first connecting portion 250 from being detached from the module substrate 100 or the first substrate 210. This may make it possible to improve reliability of the semiconductor module 1. The first mold layer 610 may extend into gap regions between the first electronic component 410 and the module substrate 100 and between the first semiconductor chip 510 and the module substrate 100 to hermetically cover the first interposer 415 and the first terminal 515. The first mold layer 610 may be provided to expose the first taps 310. The first mold layer 610 may have a top surface that is substantially coplanar with that of the first passivation layer 213.

The second semiconductor chips 520 and the second electronic component 420 may be mounted on the second surface 100b of the second region R2 of the module substrate 100. The second semiconductor chips 520 may include at least one of a memory device or a logic device, same as or similar to that of the first semiconductor chip 510. The second electronic component 420 may include at least one of a capacitor, a resistor, or an inductor, same as or similar to that of the first electronic component 410. The second electronic component 420 may be coupled to the second connection pad 132 through a second interposer 425 and connection pads thereon. The second semiconductor chips 520 may be coupled to second connection pads 132 through second terminals 525 and connection pads thereon.

The second substrate 220 may be provided on the second surface 100b of the first region R1 of the module substrate 100. The second substrate 220 may be provided to be parallel to the second direction D2. When viewed in a plan view, the second substrate 220 may overlap with the first substrate 210. As an example, a printed circuit board may be used as the second substrate 220. One or more second connecting portions 260 may be interposed between the module substrate 100 and the second substrate 220 and may be coupled to respective connection pads of the second substrate 220 and a lower pad 125. The second connecting portion 260 may be provided in the form of a bump or a solder. The second substrate 220 may have a top surface 220a facing the module substrate 100 and a bottom surface 220b opposite to the top surface 220a. The bottom surface 220b of the second substrate 220 may be positioned at a lower level than that of the second surface 100b of the second region R2 of the module substrate 100.

Second taps 320 may be disposed on the bottom surface 220b of the second substrate 220. The second taps 320 may be adjacent to the side 100c of the module substrate 100. As shown in FIG. 1A, the second taps 320 may be arranged in the second direction D2. When viewed in a plan view, each of the second taps 320 may have a longitudinal axis parallel to the first direction D1. The second taps 320 may be formed of or include at least one metal (e.g., copper or aluminum). Each of the second taps 320 may be a portion of the circuit pattern of the second substrate 220 exposed by a second passivation layer 223.

The second mold layer 620 may be disposed on the second surface 100b of the module substrate 100 to cover the second electronic component 420 and the second semiconductor chip 520. The second mold layer 620 may be provided to hermetically cover the second connecting portion 260, the second interposers 425, and the second terminals 525. The second mold layer 620 may be formed of or include an epoxy molding compound. The second mold layer 620 may have a bottom surface that is substantially coplanar with that of the second passivation layer 223. The second mold layer 620 may provide the same advantages as the first mold layer 610.

As an example, the first semiconductor chip 510 and the second semiconductor chip 520 may include a DRAM chip, and the semiconductor module 1 may be used as a DRAM module. However, a kind of the semiconductor module 1 is not limited thereto. The numbers, the arrangements, and planar shapes of the semiconductor chips 510 and 520 and the electronic components 410, 420 may be variously changed. In certain embodiments, at least one of the first semiconductor chip 510, the second semiconductor chip 520, the first electronic component 410, and the second electronic component 420 may be omitted.

Figure 2:
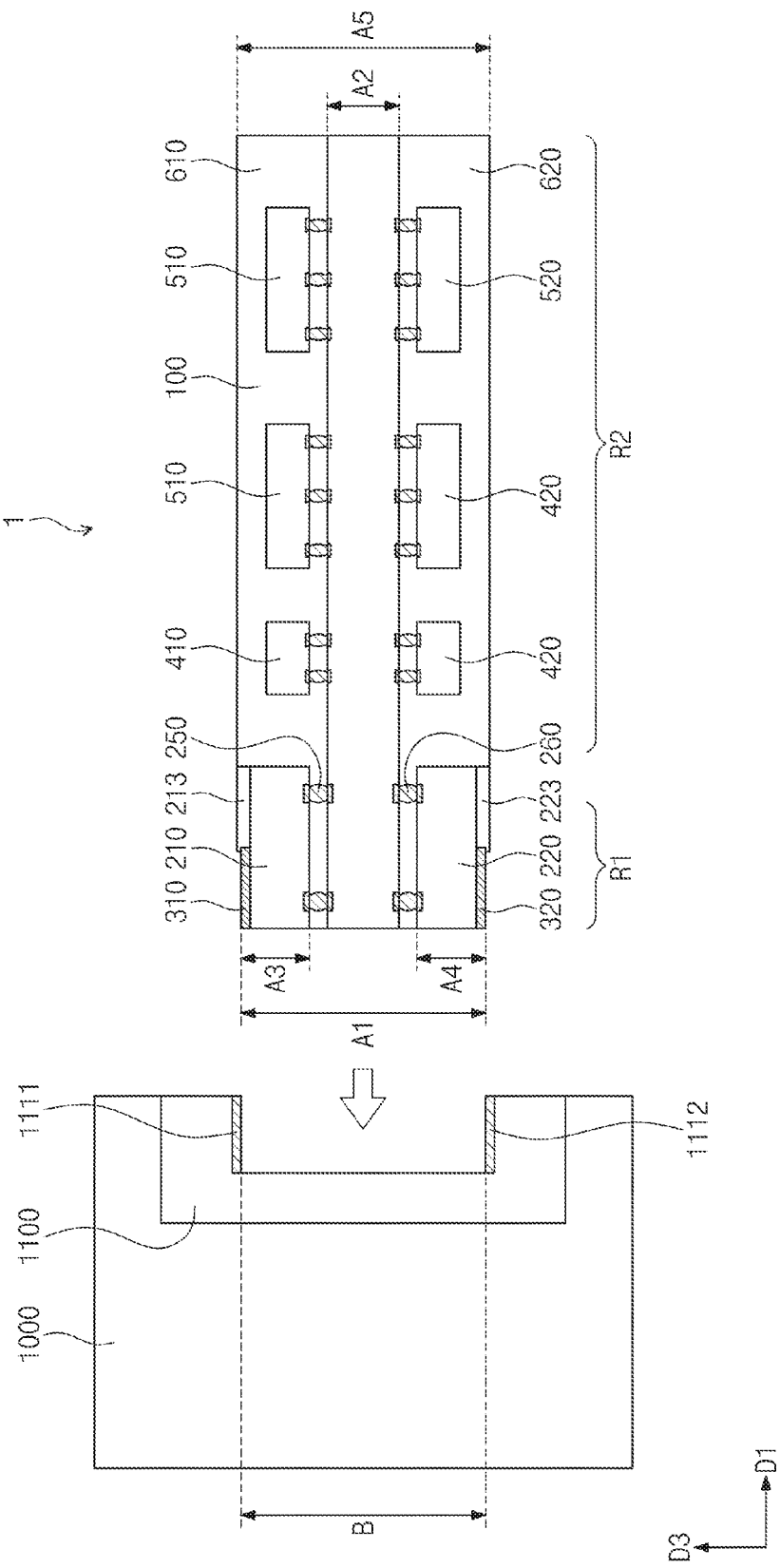
FIG. 2 is a sectional view showing how to connect a semiconductor module to an electronic device, according to an embodiment of the inventive concepts.

FIG. 2 is a sectional view showing how to connect a semiconductor module to an electronic device, according to an embodiment of the inventive concepts. A previously described element may be identified by an identical reference number without repeating an overlapping description thereof, for the sake of brevity.

Referring to FIG. 2, an electronic device 1000 may include a connector 1100. The electronic device 1000 may be an information device (e.g., portable computer or smart TV), home appliances (e.g., video player or DVD player), or mobile devices (e.g., portable multimedia player (PMP), portable DVD player, or cellular phone).

A first region R1 of the semiconductor module 1 may be inserted into the connector 1100 of the electronic device 1000. Here, the first region R1 of the semiconductor module 1 may refer to a portion of the semiconductor module 1 corresponding to the first region R1 of the module substrate 100. The connector 1100 may include first and second conductive pads 1111 and 1112, and if the semiconductor module 1 is inserted into the connector 1100, the first and second taps 310 and 320 may be coupled to the first and second conductive pads 1111 and 1112, respectively. That is, the semiconductor module 1 may be electrically connected to the electronic device 1000 through the first and second taps 310 and 320 and the first and second conductive pads 1111 and 1112. In general, the semiconductor module 1 may be provided to meet the standard for the connector 1100. For example, the semiconductor module 1 may provided to allow the first region R1 to have a thickness A corresponding to a gap distance B of the connector 1100, where the thickness A1 refers to a distance between top surfaces of the first taps 310 and bottom surfaces of the second taps 320 and the gap distance B refers to a distance between the first and second conductive pads 1111 and 1112. The thickness A1 of the first region R1 of the semiconductor module 1 may be substantially equal to or thicker than a sum of a thickness A2 of the second region R2 of the module substrate 100, a thickness A3 of the first substrate 210, and a thickness A4 of the second substrate 220. The first and second substrates 210 and 220 may be mounted on the first region R1 of the module substrate 100 to allow the thickness A1 of the first region R1 of the semiconductor module 1 to be in a range meeting the standard for the semiconductor module 1.

In the case where the first and second taps 310 and 320 are directly provided on the first and second surfaces 100a and 100b of the module substrate 100, the thickness A1 of the second region R2 of the module substrate 100 may be the same or similar to a thickness of the first region R1 of the semiconductor module 1. In some embodiments, the thickness A2 of the second region R2 of the module substrate 100 may be smaller than the thickness A1 of the first region R1 of the semiconductor module 1. For example, the first surface 100a of the module substrate 100 may be positioned at a lower level than that of the top surface 210a of the first substrate 210. The second surface 100b of the module substrate 100 may be positioned at a higher level than that of the bottom surface 220b of the second substrate 220. The semiconductor chips 510 and 520 and the electronic components 410 and 420 may be mounted on the second region R2 of the module substrate 100. Accordingly, the second region R2 of the semiconductor module 1 may have a thin thickness (e.g., a thickness A5), and thus, it is possible to reduce a size of the semiconductor module 1.

FIG. 1C is an enlarged sectional view illustrating an electric connection between the taps and the module substrate, according to an embodiment of the inventive concepts. The sectional view of FIG. 1C may correspond to a portion 'II' of FIG. 1B. A previously described element may be identified by an identical reference number without repeating an overlapping description thereof, for the sake of brevity.

Referring to FIG. 1C in conjunction with FIG. 1B, the first substrate 210 may include a first base layer 211 and a first conductive pattern. The first base layer 211 may include an insulating material. The first conductive pattern may be or include a first via 212 penetrating the first base layer 211. The first conductive pattern may also be provided on top and bottom surfaces of the first base layer 211. The first passivation layer 213 may be provided to cover the top surface 210a of the first substrate 210. As an example, the first substrate 210 may be a printed circuit board. Circuit patterns in the first substrate 210 (e.g., on the top surface 210a) may be exposed by the first passivation layer 213, and such circuit patterns may serve as the first taps 310. The first taps 310 may be electrically connected to one or more metal patterns 109 of the module substrate 100 through the first via 212 of the first conductive pattern. The vias and conductive patterns in this disclosure may be formed of any well-known conductive material (e.g., copper or aluminum).

The second substrate 220 may include a second base layer 221 and a second conductive pattern. The second conductive pattern may be or include a second via 222 penetrating the second base layer 221. The second passivation layer 223 may be provided to cover the bottom surface 220b of the second substrate 220. Circuit patterns in the second substrate 220 (e.g., on the bottom surface 220b) may be exposed by the first passivation layer 213, and such circuit patterns may serve as the second taps 320. The second taps 320 may be electrically connected to one or more of the metal patterns 109 of the module substrate 100 through the second via 222 of the second conductive pattern. Some examples of the insulating layers and the metal patterns 109 of the module substrate 100 are described and illustrated above, but the inventive concepts are not limited thereto.

FIG. 1D is an enlarged sectional view illustrating an electric connection between the taps and the module substrate, according to an embodiment of the inventive concepts. The sectional view of FIG. 1D may correspond to a portion 'II' of FIG. 1B. A previously described element may be identified by an identical reference number without repeating an overlapping description thereof, for the sake of brevity.

Referring to FIG. 1D, the first substrate 210 and the second substrate 220 may be mounted on the first region R1 of the module substrate 100. The module substrate 100 may be configured to have the same or substantially the same features as that described above. A plurality of first base layers 211 may be provided as the first substrate 210, and the first conductive pattern may include one or more first conductive layers 214 and multiple first vias 212. Each first conductive layer 214 may be interposed between a respective stacked pair of the first base layers 211. Circuit patterns in the first substrate 210 (e.g., on the top surface 210a) may be exposed by the first passivation layer 213, and such circuit patterns may serve as the first taps 310. The first taps 310 may be electrically connected to the module substrate 100 through the first vias 212, the first conductive layers 214, and the first connecting portions 250.

The second substrate may be provided to have a structure the same as or substantially the same as that of FIG. 1C. A plurality of second base layers 221 may be provided, and the second conductive pattern may include one or more second conductive layer 224s and multiple second vias 222. Each second conductive layer 224 may be interposed between a respective stacked pair of the second base layers 221. Circuit patterns in the second substrate 220 may be exposed by the second passivation layer 223, and such circuit patterns may serve as the second taps 320. The second taps 320 may be electrically connected to the module substrate 100 through the second vias 222 and the second conductive layers 224.

It will be further appreciated from FIGS. 1C and 1D, the module substrate 100 may be a PCB including a plurality of stacked layers, and provide electrical connections using conductive patterns including vias and conductive layers.

Figure 3A:
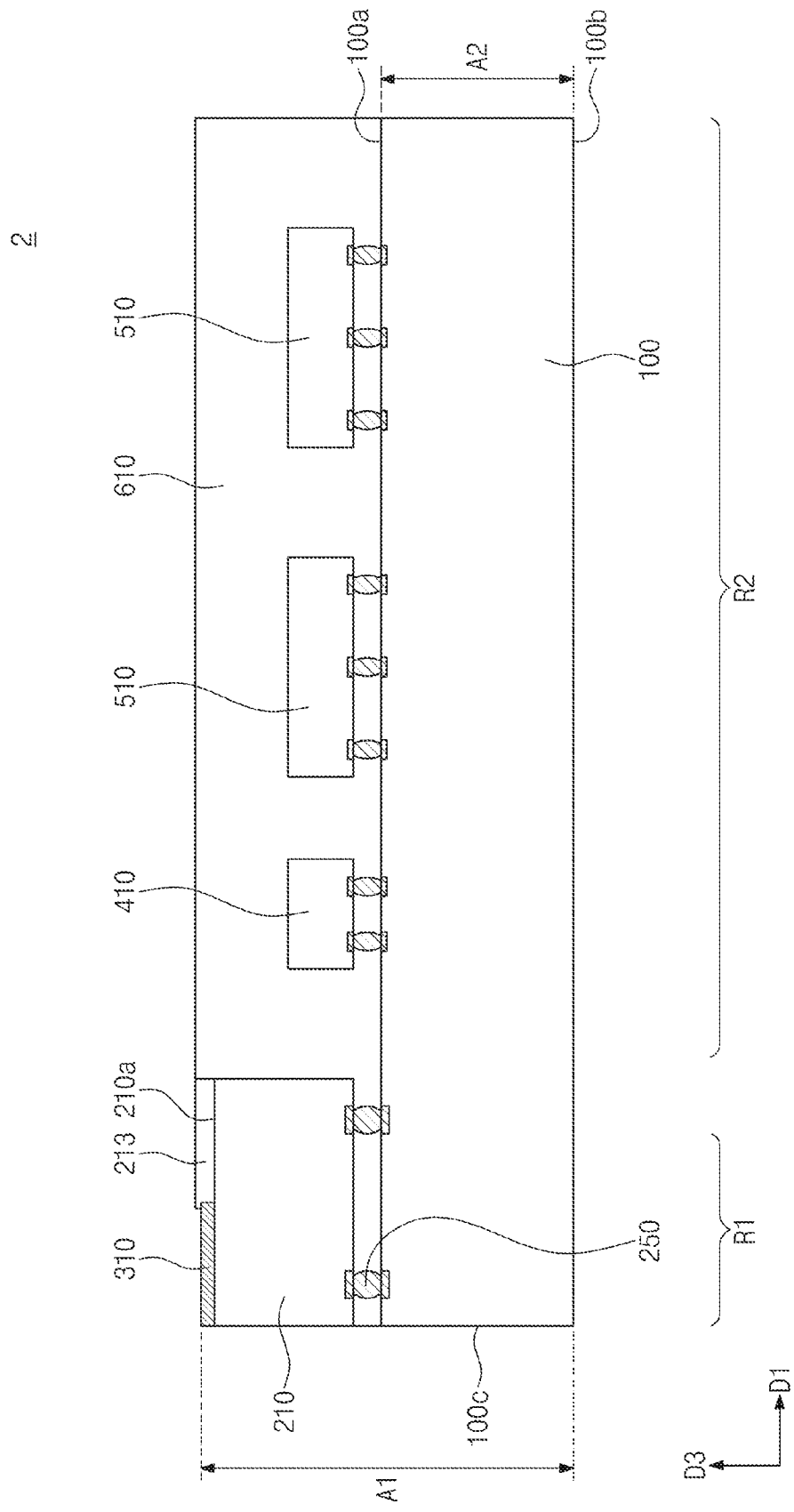
FIG. 3A is a sectional view illustrating a semiconductor module according to an embodiment of the inventive concepts.

FIG. 3A is a sectional view illustrating a semiconductor module according to an embodiment of the inventive concepts. For example, FIG. 3A illustrates a vertical section of the semiconductor module, taken along line I-I' of FIG. 1A.

Referring to FIG. 3A in conjunction with FIG. 1A, a semiconductor module 2 may include the module substrate 100, the first substrate 210, the first tap 310, the first electronic component 410, the one or more first semiconductor chips 510, and the first mold layer 610. Unlike the embodiment illustrated in FIG. 1B, the second substrate 220, the second semiconductor chips 520, the second electronic component 420, the second mold layer 620, and the second taps 320 may not be provided.

The first substrate 210 may be provided to allow the thickness A1 of the first region R1 of the semiconductor module 2 to be within a range meeting the standard for the semiconductor module. The thickness A2 of the second region R2 of the module substrate 100 may be smaller than the thickness A1 of the first region R1 of the semiconductor module 2. The first surface 100a of the second region R2 of the module substrate 100 may be positioned at a lower level than that of the top surface 210a of the first substrate 210. The first electronic component 410 and the first semiconductor chips 510 may be mounted on the first surface 100a of the second region R2 of the module substrate 100.

Figure 3B:
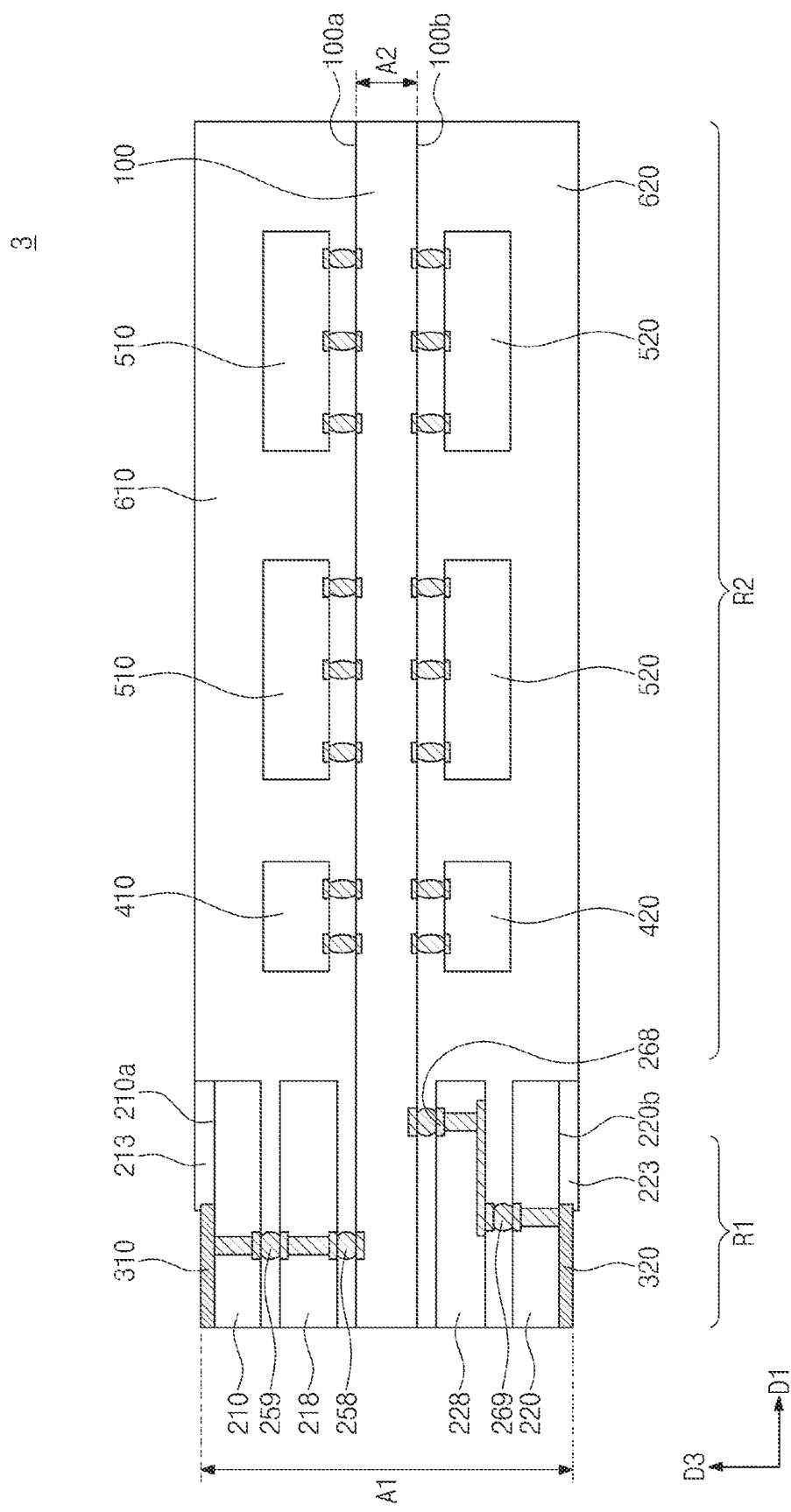
FIG. 3B is a sectional view illustrating a semiconductor module according to an embodiment of the inventive concepts.

FIG. 3B is a sectional view illustrating a semiconductor module according to an embodiment of the inventive concepts. For example, FIG. 3B illustrates a vertical section of the semiconductor module, taken along line I-I' of FIG. 1A.

Referring to FIG. 3B in conjunction with FIG. 1A, a semiconductor module 3 may include a module substrate 100, a first tap 310, a second tap 320, one or more first semiconductor chips 510, one or more second semiconductor chips 520, a first electronic component 410, a second electronic component 420, a first mold layer 610, and a second mold layer 620. The module substrate 100, the first and second taps 310 and 320, the electronic components 410 and 420, the semiconductor chips 510 and 520, and the mold layers 610 and 620 may be configured to have the same or substantially the same features as that described with reference to FIGS. 1A and 1B.

A third substrate 218 may be interposed between the module substrate 100 and the first substrate 210. One or more third connecting portions 258 may be disposed between the module substrate 100 and the third substrate 218. One or more first connecting portions 259 may be disposed between the third substrate 218 and the first substrate 210. The first taps 310 may be disposed on the top surface 210a of the first substrate 210. The first taps 310 may be electrically connected to the module substrate 100 through the first substrate 210, the first connecting portion 259, the third substrate 218, and the third connecting portion 258. The first connecting portion 259 may be aligned to the third connecting portion 258 in a third direction D3. The first connecting portion 259 and the third connecting portion 258 may be solder or solder balls.

A fourth substrate 228 may be interposed between the module substrate 100 and the second substrate 220. The second taps 320 may be disposed on the bottom surface 220b of the second substrate 220. The second taps 320 may be electrically connected to the module substrate 100 through the second substrate 220, a second connecting portion 269, the fourth substrate 228, and a fourth connecting portion 268. The second connecting portion 269 may not be aligned to the fourth connecting portion 268 in the third direction D3. For example, the second connecting portion 269 may be shifted in the first direction D1 with respect to the fourth connecting portion 268 and may be electrically coupled to the fourth connecting portion 268 through via and circuit patterns provided in the fourth substrate 228. A vertical alignment between the first to fourth connecting portions 259, 269, 258, and 268 and an arrangement of circuit and via patterns in the first to fourth substrates 210, 220, 218, and 228 may be variously changed. The second and fourth connecting portions 269 and 268 may be solder or solder balls.

The first to fourth substrates 210, 220, 218, and 228 may be provided on the first region R1 of the module substrate 100 to allow the thickness A1 of the first region R1 of the semiconductor module 3 to be in a range meeting the standard for the semiconductor module. The number of the first to fourth substrates 210, 220, 218, and 228 stacked on the module substrate 100 may not be limited to that illustrated in FIG. 3B. The thickness A2 of the second region R2 of the module substrate 100 may be smaller than the thickness A1 of the first region R1 of the semiconductor module 3. Furthermore, a thickness of the module substrate 100, the first substrate 210, the second substrate 220, the third substrate 218, and/or the fourth substrate 228 may be the same.

Figure 3C:
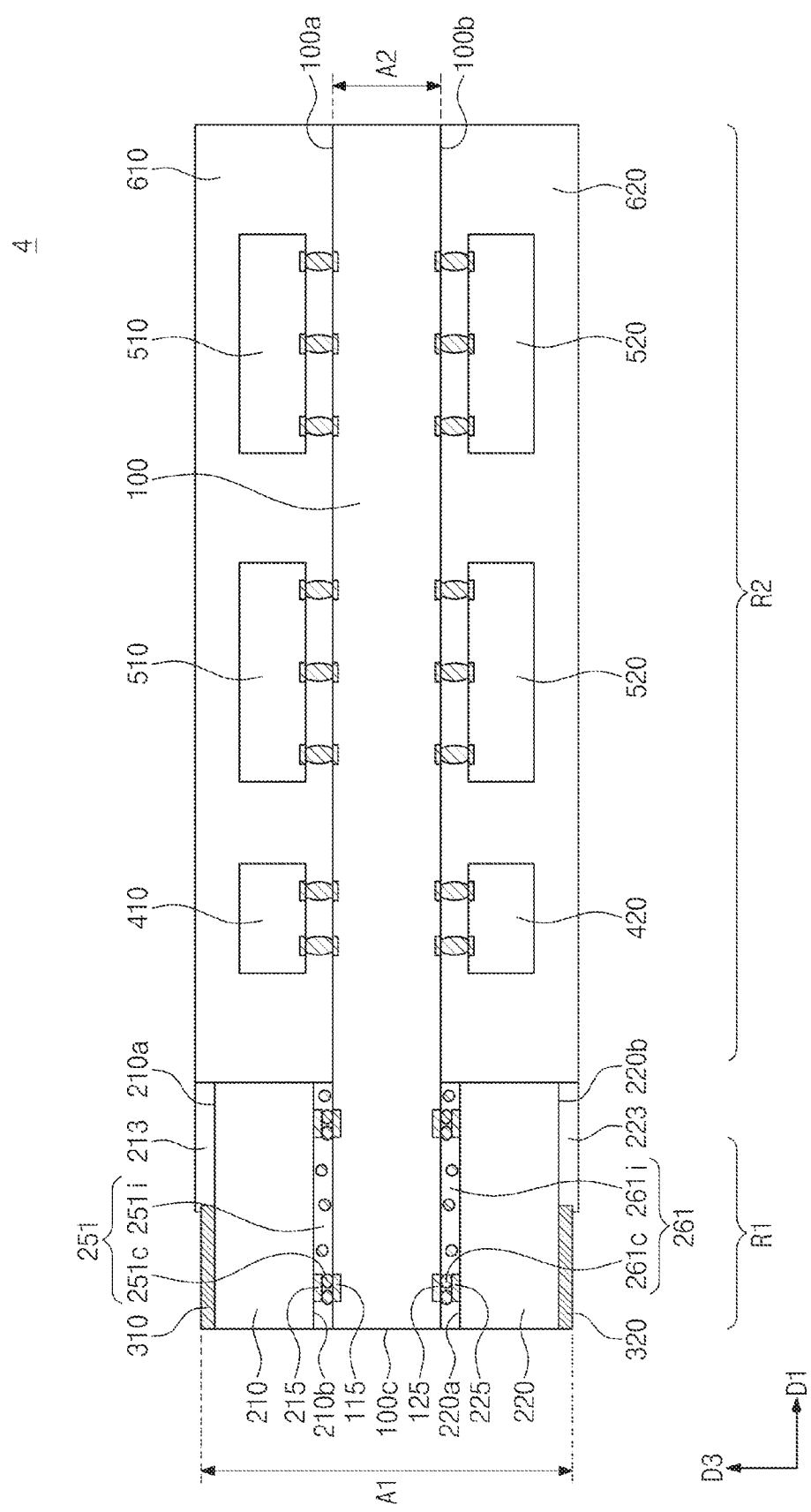
FIG. 3C is a sectional view illustrating a semiconductor module according to an embodiment of the inventive concepts.

FIG. 3C is a sectional view illustrating a semiconductor module according to an embodiment of the inventive concepts. For example, FIG. 3C illustrates a vertical section of the semiconductor module, taken along line I-I' of FIG. 1A. A previously described element may be identified by an identical reference number without repeating an overlapping description thereof, for the sake of brevity.

Referring to FIG. 3C, a semiconductor module 4 may include the module substrate 100, the first substrate 210, the second substrate 220, the first electronic component 410, the second electronic component 420, the first semiconductor chips 510, the second semiconductor chips 520, the first mold layer 610, and the second mold layer 620. The thickness A1 of the first region R1 of the semiconductor module 4 may be within a range satisfying the standard for the semiconductor module. A first pad 215 may be provided on the bottom surface 210b of the first substrate 210. A second pad 225 may be provided on the top surface 220a of the second substrate 220.

A first connecting portion 251 may be interposed between the module substrate 100 and the first substrate 210. An anisotropic conductive film may be used as the first connecting portion 251. For example, the first connecting portion 251 may include a first insulating polymer 251i and first conductive particles 251c, and the first conductive particles 251c may be provided in the insulating polymer 251i. The first conductive particles 251c may be coupled to the first pad 215 and the upper pad 115. The module substrate 100 may be electrically connected to the first taps 310 through the first conductive particles 251c.

A second connecting portion 261 may be interposed between the module substrate 100 and the second substrate 220. The second connecting portion 261 may include an anisotropic conductive film. For example, the second connecting portion 261 may include a second insulating polymer 261i and second conductive particles 261c. The second conductive particles 261c may be coupled to the second pad 225 and the lower pad 125, and thus, the second taps 320 may be electrically connected to the module substrate 100.

Figure 3D:
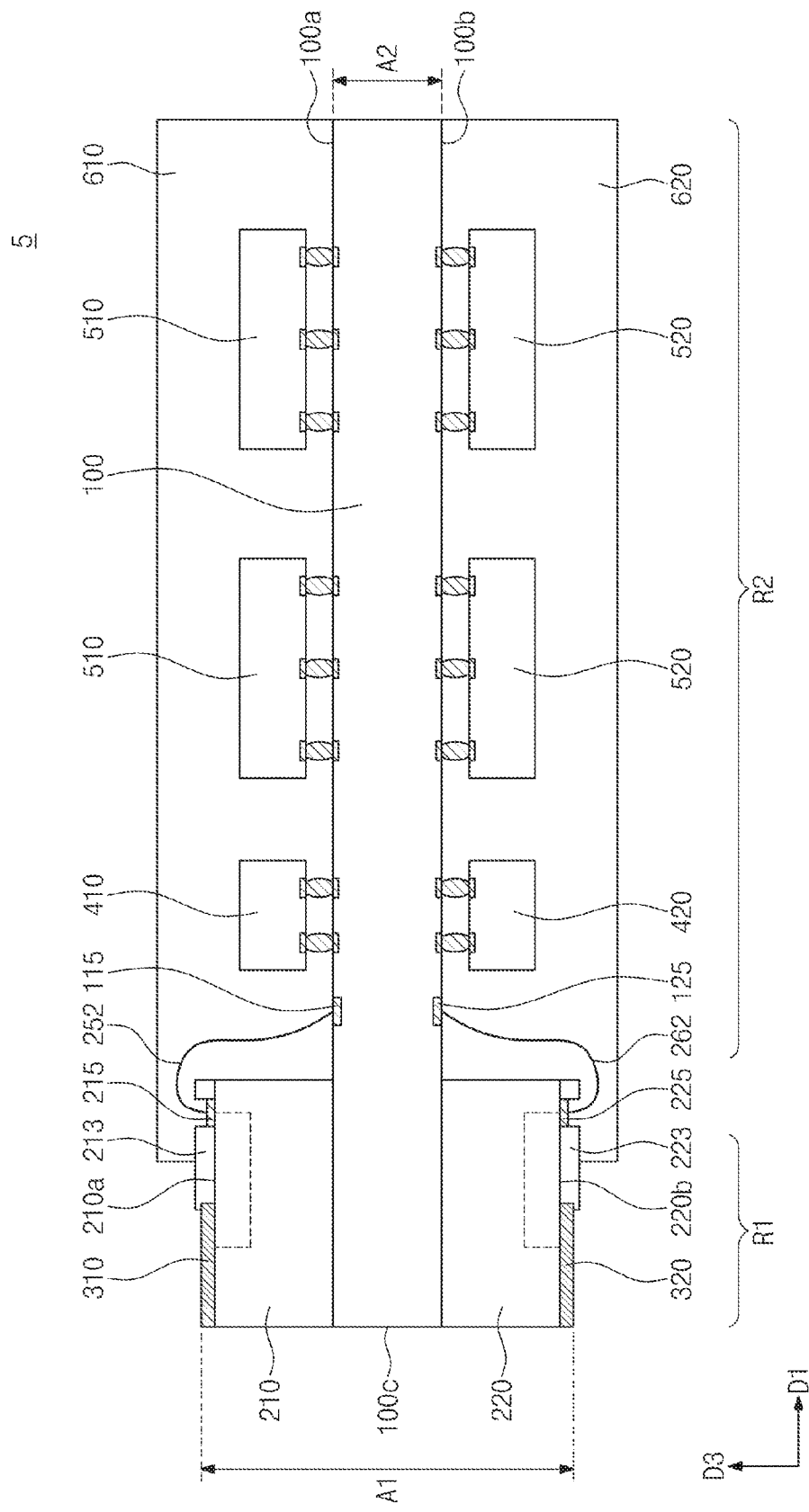
FIG. 3D is a sectional view illustrating a semiconductor module according to an embodiment of the inventive concepts.

FIG. 3D is a sectional view illustrating a semiconductor module according to an embodiment of the inventive concepts. For example, FIG. 3D illustrates a vertical section of the semiconductor module, taken along line I-I' of FIG. 1A. A previously described element may be identified by an identical reference number without repeating an overlapping description thereof, for the sake of brevity.

Referring to FIG. 3D, a semiconductor module 5 may include the module substrate 100, the first substrate 210, the second substrate 220, the first electronic component 410, the second electronic component 420, the first semiconductor chips 510, the second semiconductor chips 520, the first mold layer 610, and the second mold layer 620.

A first connecting portion 252 may be or include a bonding wire. The first pad 215 may be disposed on the top surface 210a of the first substrate 210. The first taps 310 may be coupled to the first pad 215 through the first substrate 210, as depicted in a dotted line. The first connecting portion 252 may be provided on the top surface 2110a of the first substrate 210 and may be electrically coupled to the first pad 215 and the upper pad 115. The first mold layer 610 may be extended from the first surface 100a of the second region R2 of the module substrate 100 to cover at least a portion of the top surface 210a of the first substrate 210. The first mold layer 610 may be provided to hermetically cover or seal the first pad 215 and the first connecting portion 252 and to expose the first taps 310.

A second connecting portion 262 may be or include a bonding wire. The second pad 225 may be disposed on the bottom surface 220b of the second substrate 220. The second taps 320 may be coupled to the second pad 225 through the second substrate 220, as depicted in a dotted line. The second connecting portion 262 may be provided on the bottom surface 220b of the second substrate 220 and may be electrically coupled to the second pad 225 and the lower pad 125. The second mold layer 620 may be extended to cover a portion of the bottom surface 220b of the second substrate 220 and to hermetically cover or seal the second pad 225 and the second connecting portion 262. The second taps 320 may be exposed by the second mold layer 620.

Figure 4A:
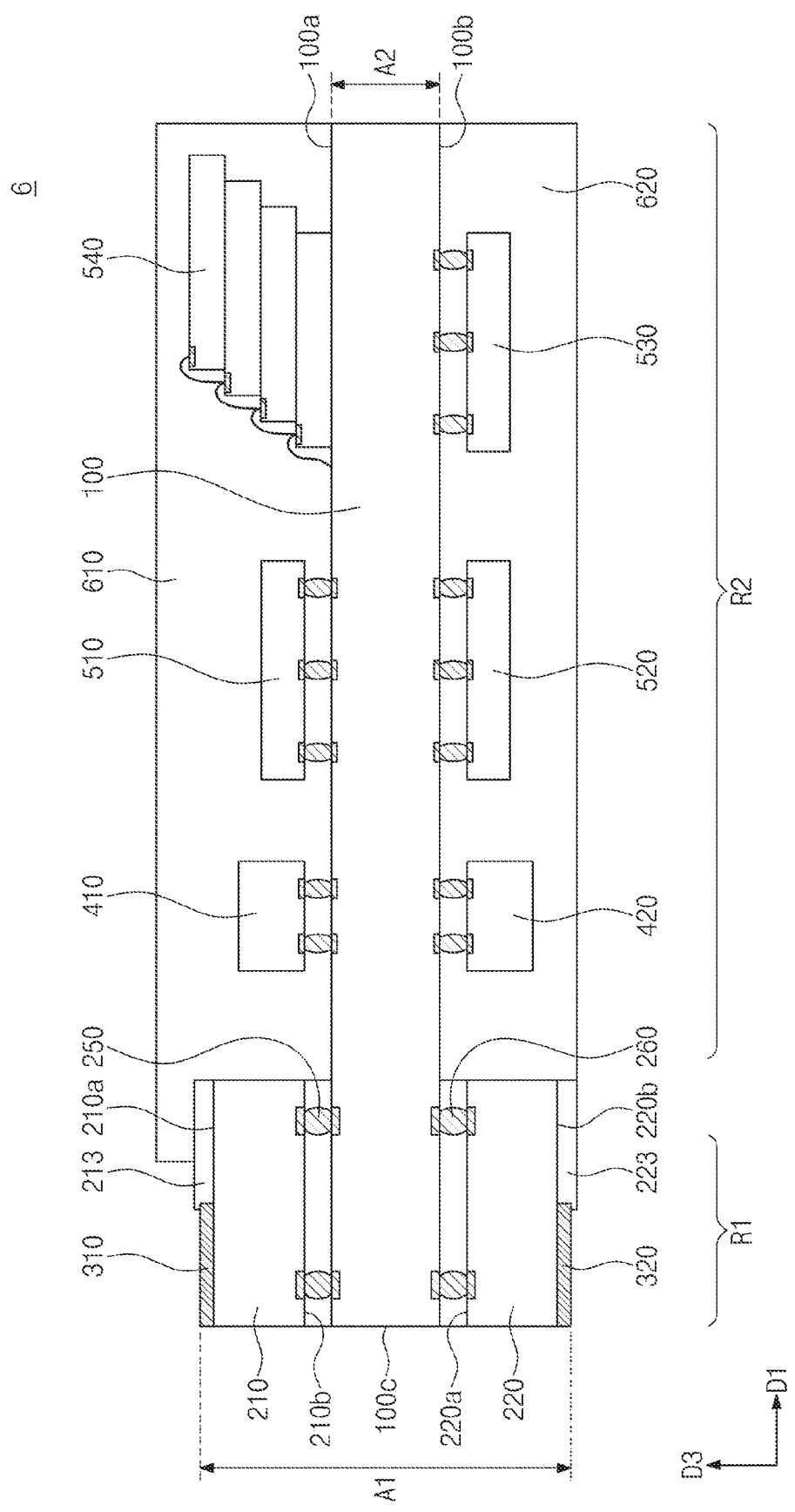
FIG. 4A is a sectional view illustrating a semiconductor module according to an embodiment of the inventive concepts.

FIG. 4A is a sectional view illustrating a semiconductor module according to an embodiment of the inventive concepts. For example, FIG. 4A illustrates a vertical section of the semiconductor module, taken along line I-I' of FIG. 1A. A previously described element may be identified by a similar or identical reference number without repeating an overlapping description thereof, for the sake of brevity.

Referring to FIG. 4A, a semiconductor module 6 may include a third semiconductor chip 530 and memory chips 540, in addition to the module substrate 100, the first substrate 210 the first tap 310, second tap 320, the second substrate 220, the first electronic component 410, the second electronic component 420, the first semiconductor chip 510, the second semiconductor chip 520, the first mold layer 610, and the second mold layer 620. The module substrate 100, the substrates 210 and 220, the taps 310 and 320, the electronic components 410 and 420, the semiconductor chips 510 and 520, and the mold layers 610 and 620 may be configured to have the same or substantially the same features as those described with reference to FIGS. 1A and 1B.

The semiconductor module 6 may be a solid state drive (SSD) module. For example, the semiconductor module 6 may be configured to read or write data from or to the memory chips 540 in response to read/write requests from an external electronic device (e.g., 1000 of FIG. 2). The first taps 310 and the second taps 320 may be used as signal paths electrically connecting the semiconductor module 6 to the electronic device 1000.

The memory chips 540 may be stacked on the first surface 100a of the second region R2 of the module substrate 100. As shown, the memory chips 540 may be stacked offset so that bonding wires may electrically connect the memory chips 540. The memory chips 540 may be nonvolatile memory chips. For example, the memory chips 540 may include NAND FLASH memory devices. Alternatively, the memory chips 540 may include PRAM, MRAM, ReRAM, FRAM, or NOR FLASH memory devices. The number and arrangement of the memory chips 540 may not be limited to that illustrated in FIG. 4A.

One of the first semiconductor chip 510, the second semiconductor chip 520, and the third semiconductor chip 530 may function as an interface, another may function as a controller, and the other may function as a buffer memory chip. For the sake of simplicity, the description that follows will refer to an example in which the first semiconductor chip 510, the second semiconductor chip 520, and the third semiconductor chip 530 are used as the interface, the controller, and the buffer memory chip, respectively; but the inventive concepts may not be limited thereto.

The first semiconductor chip 510 may include an input/output interface circuit. For example, the first semiconductor chip 510 may be configured to execute an interface operation between the electronic device 1000 and the semiconductor module 6, according to a bus format of a host.

The second semiconductor chip 520 may be configured to control an operation connecting the memory chips 540 to an external device (e.g., the electronic device 1000) through the first semiconductor chip 510. The second semiconductor chip 520 may read or write data from or to the memory chips 540, in response to commands from the electronic device 1000. The third semiconductor chip 530 may be used as the buffer memory chip. For example, the third semiconductor chip 530 may temporarily store data to be transmitted between the second semiconductor chip 520 and the memory chips 540 and/or between the second semiconductor chip 520 and the electronic device 1000. The third semiconductor chip 530 may consist of or include at least one random access memory device (e.g., DRAM or SRAM).

As another example, at least one of the first to third semiconductor chips 510, 520, and 530 may be omitted. For example, the second semiconductor chip 520 may be omitted. In this case, the first semiconductor chip 510 or the third semiconductor chip 530 may be configured to function as the controller. In certain embodiments, the second and third semiconductor chips 520 and 530 may be omitted, and the first semiconductor chip 510 may be configured to function as the interface, the controller, and the buffer memory chip.

Figure 4B:
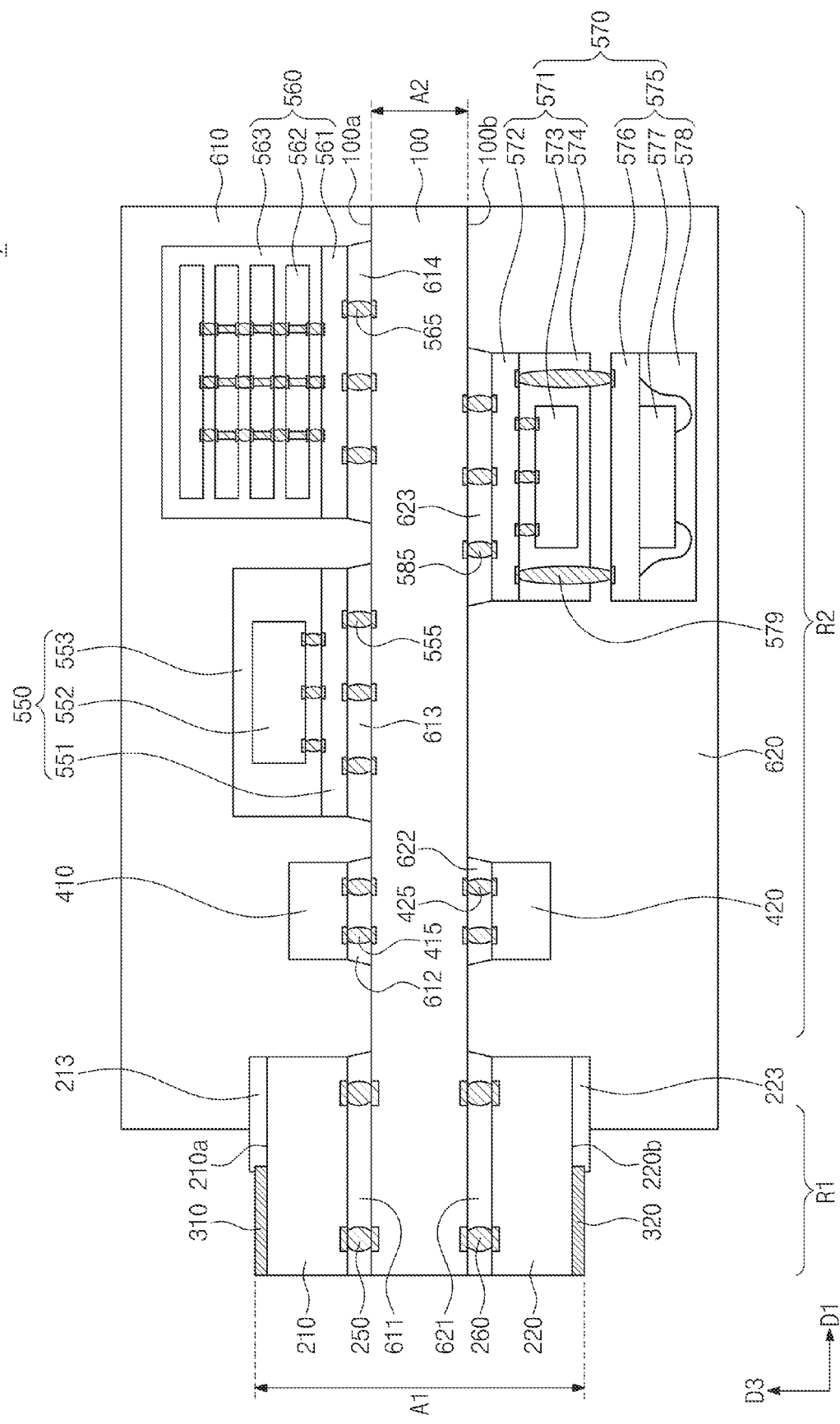
FIG. 4B is a sectional view illustrating a semiconductor module according to an embodiment of the inventive concepts.

FIG. 4B is a sectional view illustrating a semiconductor module according to an embodiment of the inventive concepts. For example, FIG. 4B illustrates a vertical section of the semiconductor module, taken along line I-I' of FIG. 1A. A previously described element may be identified by a an identical reference number without repeating an overlapping description thereof, for the sake of brevity.

Referring to FIG. 4B, a semiconductor module 7 may further include a first package 550, a second package 560, and a third package 570, in addition to the module substrate 100, the first substrate 210, the second substrate 220, the first taps 310, second taps 320, the first electronic component 410, the second electronic component 420, the first mold layer 610, and the second mold layer 620.

The first package 550 may be provided on the first surface 100a of the second region R2 of the module substrate 100. The first package 550 may include a first package substrate 551, a first chip 552, and a first molding pattern 553. The first package 550 may be electrically connected to the module substrate 100 through first connection terminals 555. More particularly, the first chip 552 may be electrically connected to the module substrate 100 via the first package substrate 551. The second package 560 may be provided on the first surface 100a of the second region R2 of the module substrate 100. The second package 560 may include a second package substrate 561, second chips 562, and a second molding pattern 563. A plurality of the second chips 562 may be stacked on the second package substrate 561. The second package 560 may be coupled to the module substrate 100 through a second connection terminal 565. More particularly, the second chips 562 may be electrically connected to one another, and electrically connected to the module substrate 100 via the second package substrate 561.

A first under-fill layer 611 may be interposed between the module substrate 100 and the first substrate 210 to hermetically cover or seal the first connecting portion 250. A first device under-fill layer 612 may be interposed between the module substrate 100 and the first electronic component 410. First and second package under-fill layers 613 and 614 may be respectively interposed between the module substrate 100 and the first and second packages 550 and 560. The first mold layer 610 may be provided on the first surface 100a of the module substrate 100 to cover the first electronic component 410, the first package 550, and the second package 560. Although not illustrated, the first under-fill layer 611, the first device under-fill layer 612, the first package under-fill layer 613, and the second package under-fill layer 614 may be omitted, and the first mold layer 610 may be provided to hermetically cover or seal the first connecting portion 250, the first interposer 415, the first connection terminal 555, and the second connection terminal 565. In certain embodiments, the first mold layer 610 may be omitted.

The third package 570 may be mounted on the first surface 100a of the second region R2 of the module substrate 100. The third package 570 may include a lower package 571 and an upper package 575 thereon. The lower package 571 may include a lower substrate 572, a lower chip 573, and a lower molding pattern 574. The upper package 575 may include an upper substrate 576, an upper chip 577, and an upper molding pattern 578. A connection bump 579 may be provided between and coupled to the lower substrate 572 and the upper substrate 576. The third package 570 may be coupled to the module substrate 100 through a third connection terminal 585. The lower substrate 572 and upper substrate 576 electrically connects the upper chip 577 to the module substrate 100, and the lower substrate 572 electrically connects the lower chip 573 to the module substrate 100.

A second under-fill layer 621 may be interposed between the module substrate 100 and the second substrate 220 to hermetically cover or seal the second connecting portion 260. A second device under-fill layer 622 may be provided between the module substrate 100 and the second electronic component 420. A third package under-fill layer 623 may be provided between the module substrate 100 and the third package 570. The second mold layer 620 may be provided on the second surface 100b of the module substrate 100 to cover the second electronic component 420 and the third package 570. As an example, the second under-fill layer 621, the second device under-fill layer 622, the third package under-fill layer 623 may be omitted, and the second mold layer 620 may be provided to hermetically cover or seal the first connecting portion 250, the second interposer 425, and the third connection terminal 585. In certain embodiments, the second mold layer 620 may be omitted.

In the above embodiment, the first package 550 may be a memory controller, the second package 560 may be a non-volatile memory device, and the third package 570 may be an application processor.

Hereinafter, a process of manufacturing a semiconductor module will be described.

Figure 5A:
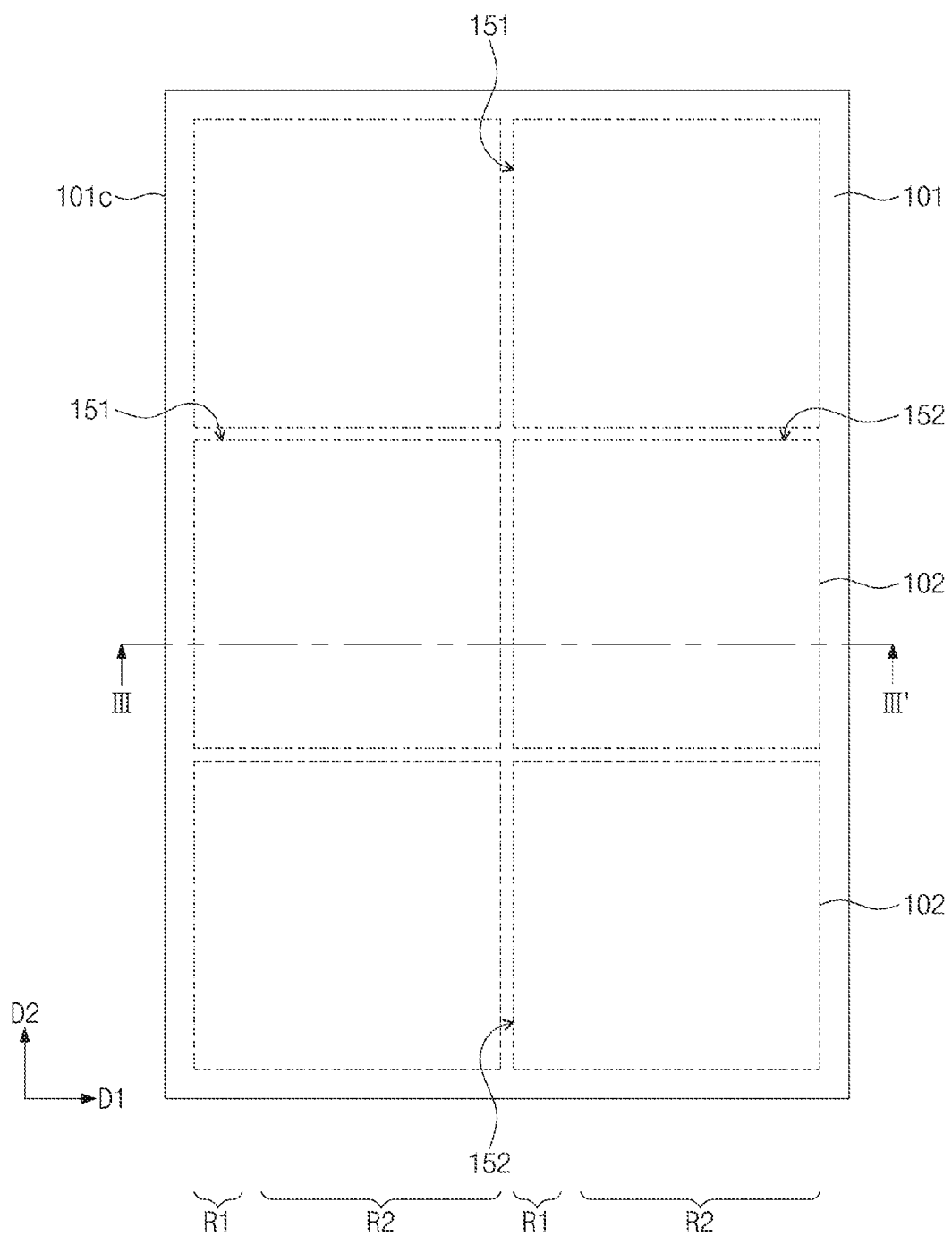
FIGS. 5A, 6A, and 7A are plan views illustrating a process of manufacturing a semiconductor module, according to an embodiment of the inventive concepts.
Figure 5B:
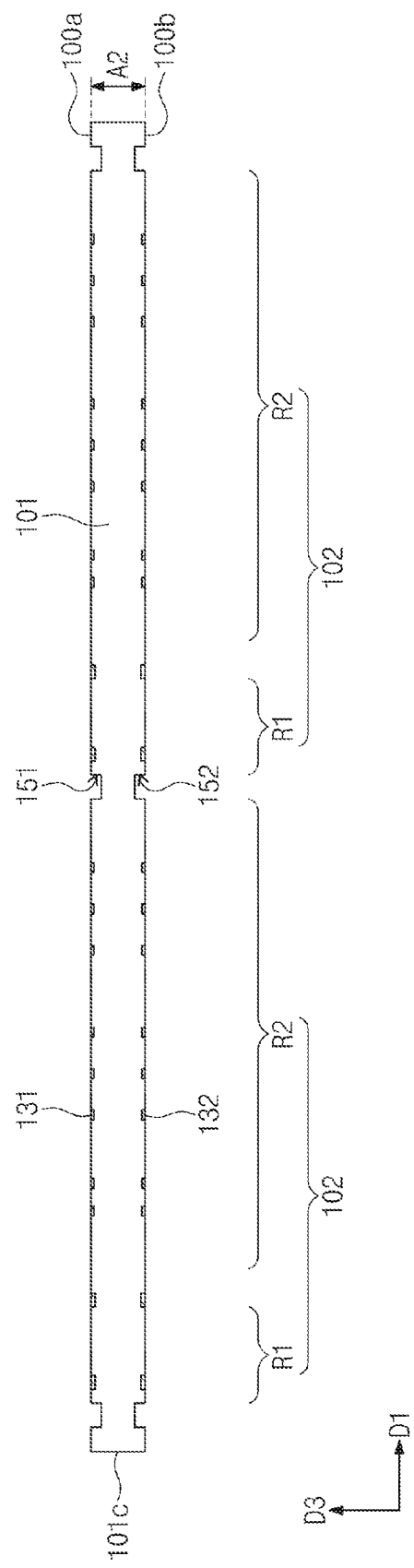
FIGS. 5B, 6B, and 7B are sections taken along line III-III' of FIGS. 5A, 6A, and 7A, respectively.
Figure 6A:
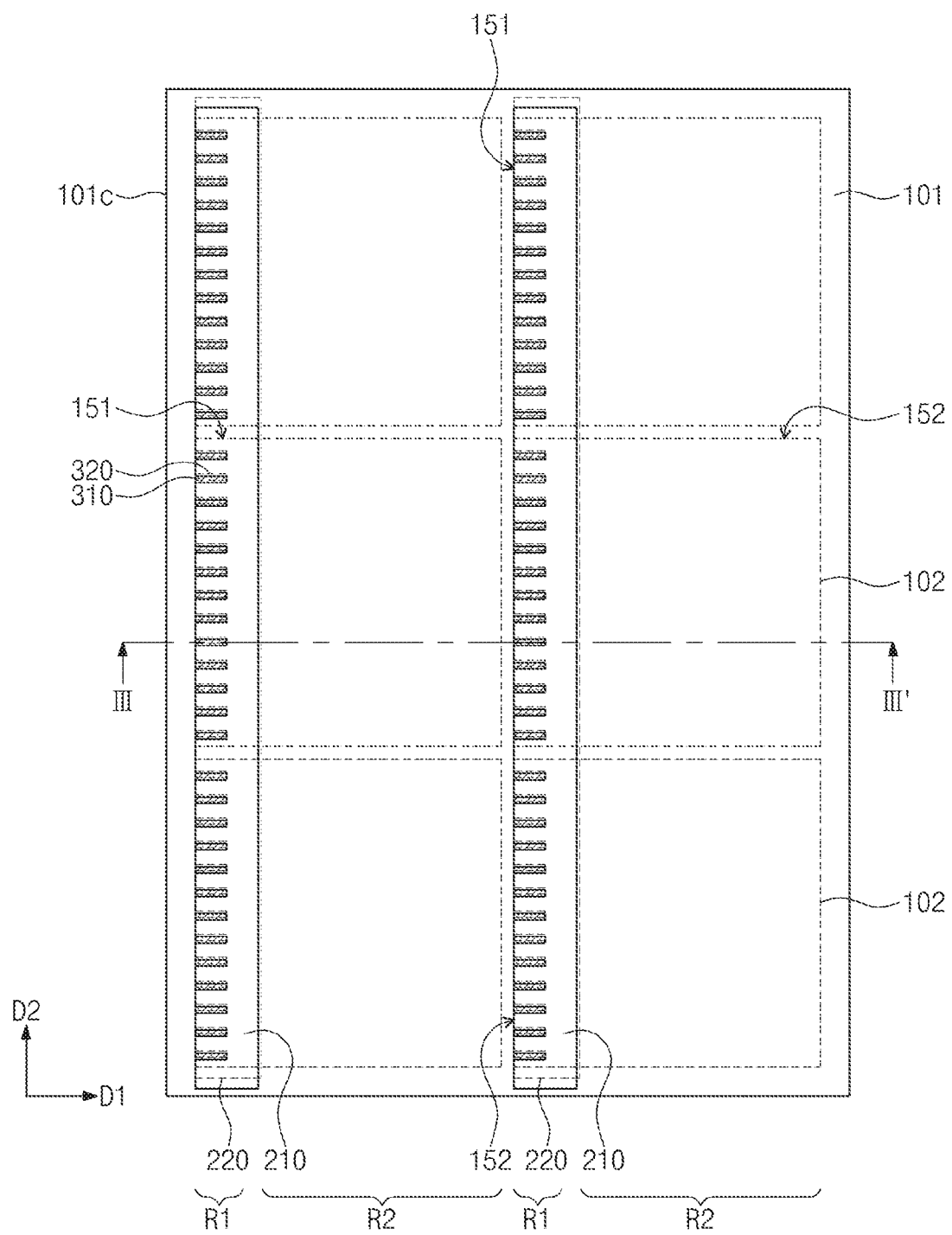
Figure 6B:
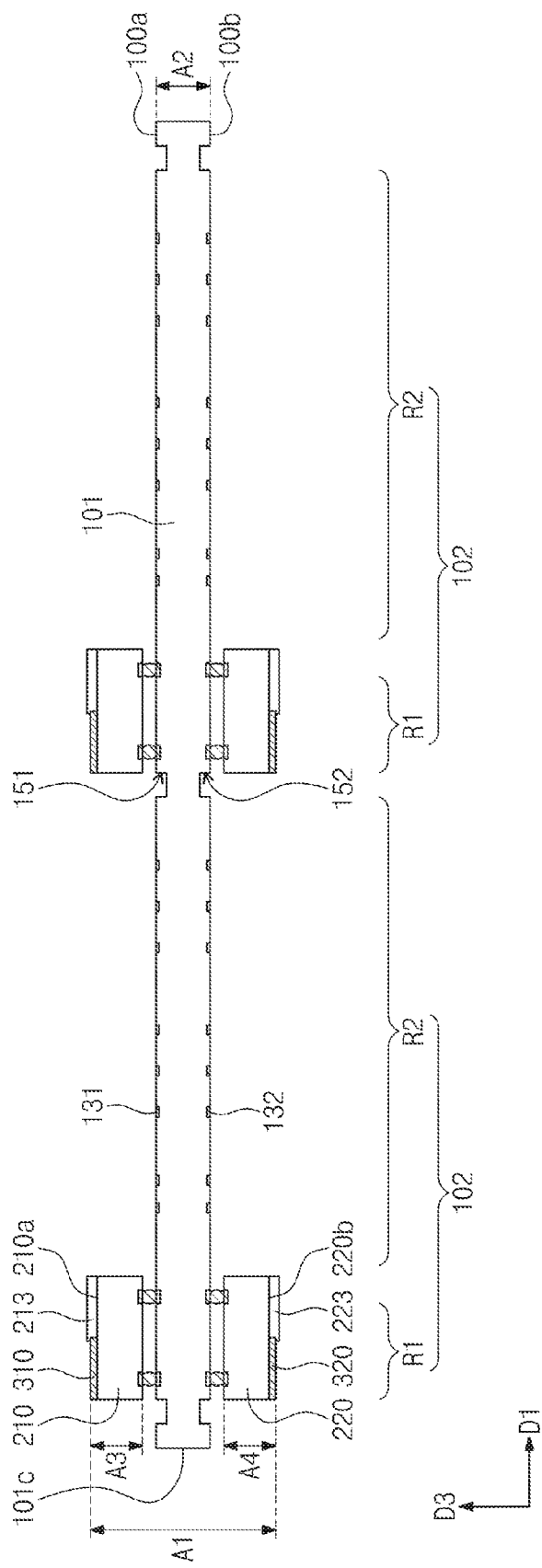
Figure 7A:
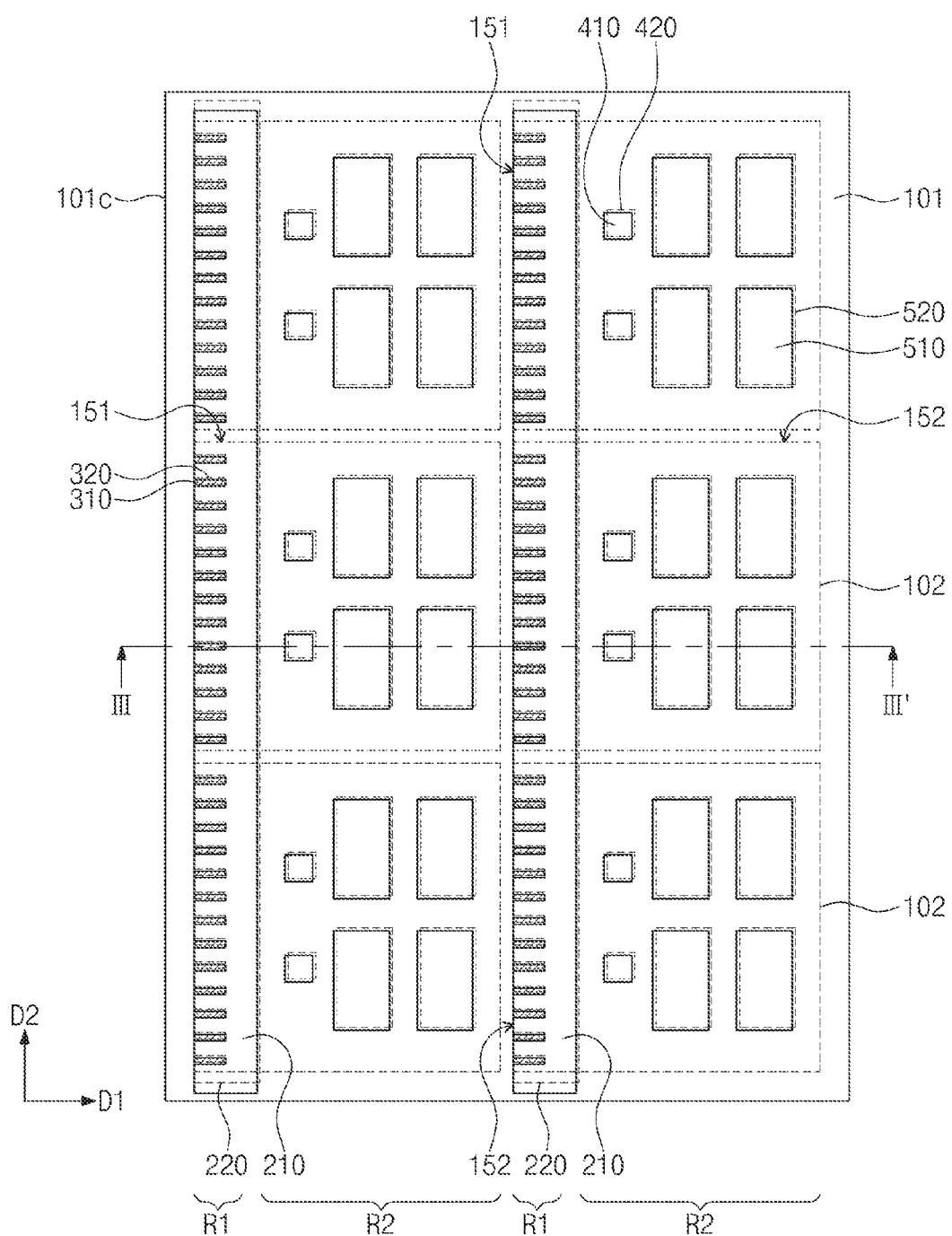
Figure 7B:
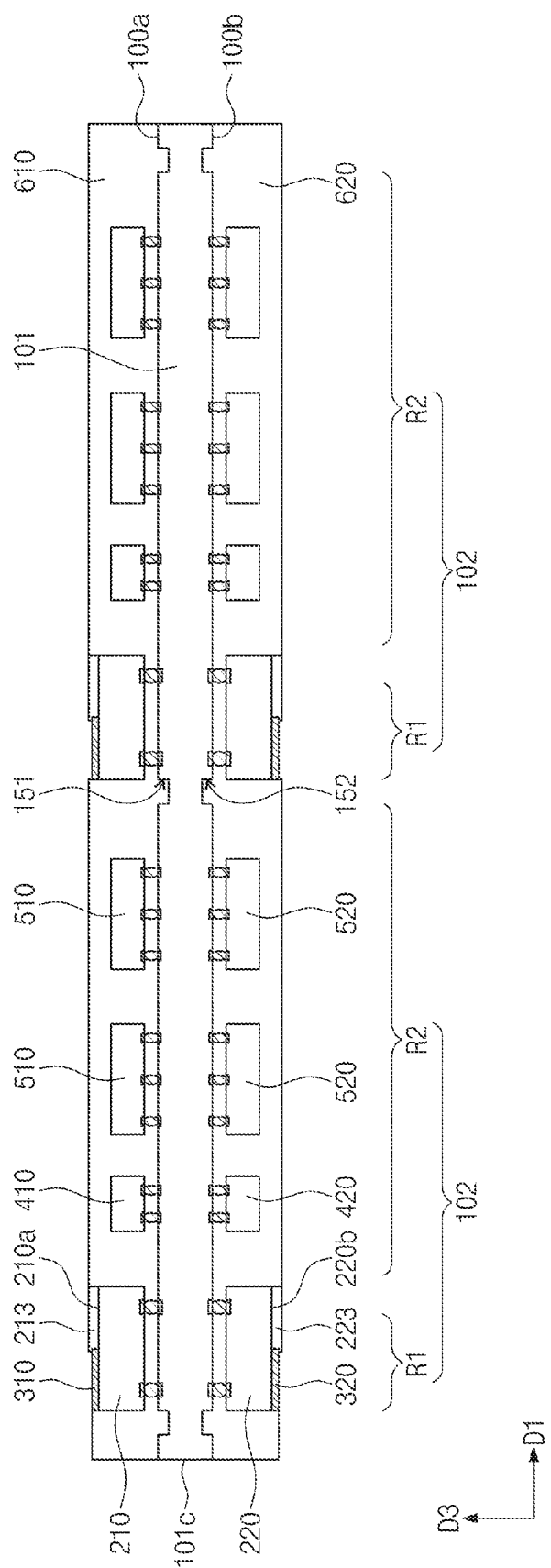

FIGS. 5A, 6A, and 7A are plan views illustrating a process of manufacturing a semiconductor module, according to an embodiment of the inventive concepts. FIGS. 5B, 6B, and 7B are sections taken along line III-III' of FIGS. 5A, 6A, and 7A, respectively. A previously described element may be identified by an identical reference number without repeating an overlapping description thereof, for the sake of brevity.

Referring to FIGS. 5A and 5B, a module strip 101 including a plurality of module regions 102 may be provided. As shown in FIG. 5A, the module regions 102 may be arranged in the first and second directions D1 and D2, when viewed in a plan view. The module regions 102 may be defined by scribe lines 151 and 152. As shown in FIG. 5B, the scribe lines 151 and 152 may be recessed regions that are formed on the first and second surfaces 100a and 100b of the module strip 101. Each of the module regions 102 may include a first region R1 and a second region R2. In some embodiments, the module strip 101 may be configured to include a plurality of the first regions R1. The first regions R1 may be provided to be adjacent to a side 101c of the module strip 101.

The first connection pad 131 and the second connection pad 132 may be provided on the second region R2 of the module strip 101. The first connection pad 131 and the second connection pad 132 may be provided on the first and second surfaces 100a and 100b, respectively, of the module strip 101. The module strip 101 may have a uniform thickness. For example, the thickness A2 of the second region R2 of the module strip 101 may be the same or substantially the same as a thickness of the first region R1.

Referring to FIGS. 6A and 6B, the first substrate 210 and the second substrate 220 may be mounted on the module strip 101. In some embodiments, the first substrate 210 provided with the first taps 310 may be prepared. For example, a printed circuit board may be used as the first substrate 210, and the first taps 310 may be some of circuit patterns provided in the first substrate 210. The first substrate 210 may be disposed on the first surface 100a of the module strip 101. The first substrate 210 may be disposed on the first surface 100a of the module substrate 100 and may be provided to extend in the second direction D2 and to cross a plurality of the module regions 102. When viewed in a plan view, the first substrate 210 may be overlapped with the plurality of the first regions R1. The first substrate 210 may not cover the second regions R2.

The second substrate 220 provided with the second taps 320 may be prepared. The second substrate 220 may be disposed on the second surface 100b of the module strip 101. As shown in FIG. 6A, the second substrate 220 may be provided to extend in the second direction D2 and to cross a plurality of the module regions 102. When viewed in a plan view, the second substrate 220 may be overlapped with the first regions R1.

The first region R1 of the module strip 101 may have a thickness A1 which is defined as a distance between top surfaces of the first taps 310 and bottom surfaces of the second taps 320. The thickness A1 of the first region R1 of the module strip 101 may be substantially equal to or greater than a sum of the thickness A2 of the second region R2 of the module region 102, the thickness A3 of the first substrate 210, and the thickness A4 of the second substrate 220. The first substrate 210 and the second substrate 220 may be provided to allow the thickness A1 of the first region R1 of the module strip 101 to be within a range meeting the standard for the semiconductor module. The thickness A2 of the second region R2 of the module strip 101 may be smaller than the thickness A1 of the first region R1 of the module strip 101.

Referring to FIGS. 7A and 7B, the first semiconductor chip 510, the first electronic component 410, and the first mold layer 610 may be mounted on the first surface 100a of the module strip 101. The second semiconductor chip 520, the second electronic component 420, and the second mold layer 620 may be mounted on the second surface 100b of the module strip 101. Referring to FIGS. 7A and 7B in conjunction with FIGS. 1A and 1B, a sawing process may be performed on the module strip 101 along the scribe lines 151 and 152, and thus, the module strip 101 may be divided into the module regions 102. After the sawing process, each of the module regions 102 of the module strip 101 may be used as the module substrate 100 of FIGS. 1A and 1B. In certain embodiments, the first substrate 210, the second substrate 220, and the mold layers 610 and 620, along with the module strip 101, may be divided by the sawing process. The resulting structure may have the same structure as the semiconductor module 1 described with reference to FIGS. 1A and 1B.

Figure 8A:
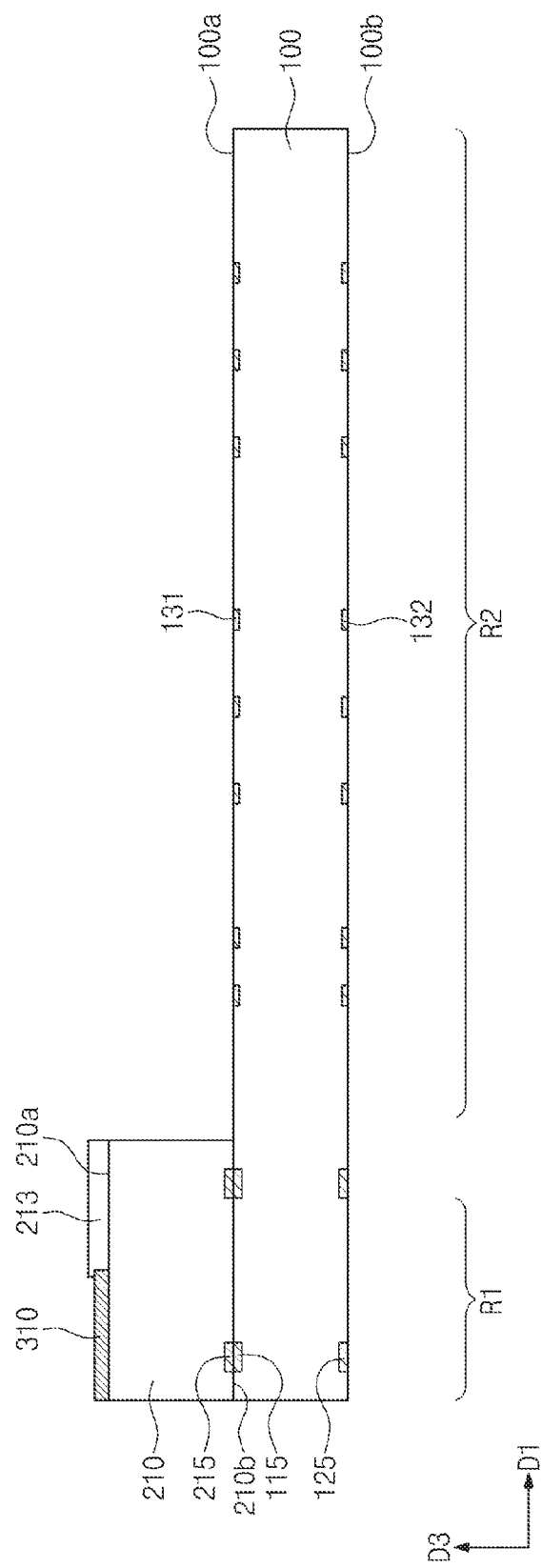
FIGS. 8A, 8B, and 8C are sectional views illustrating a process of forming a semiconductor module, according to an embodiment of the inventive concepts.
Figure 8B:
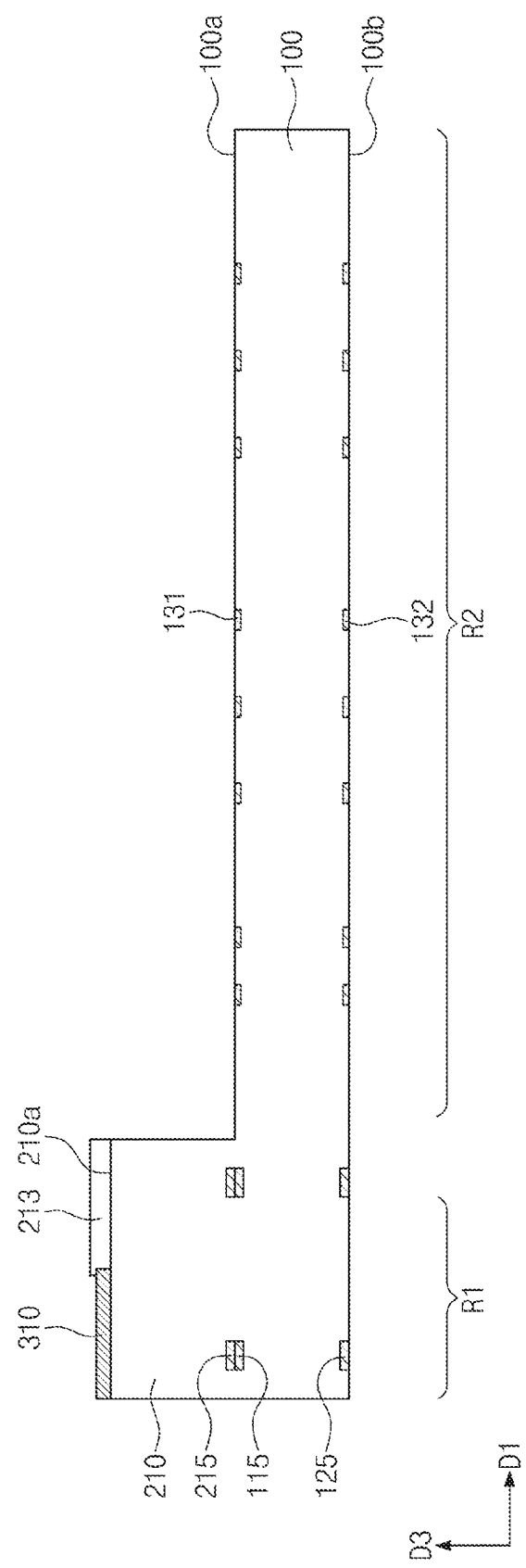
Figure 8C:
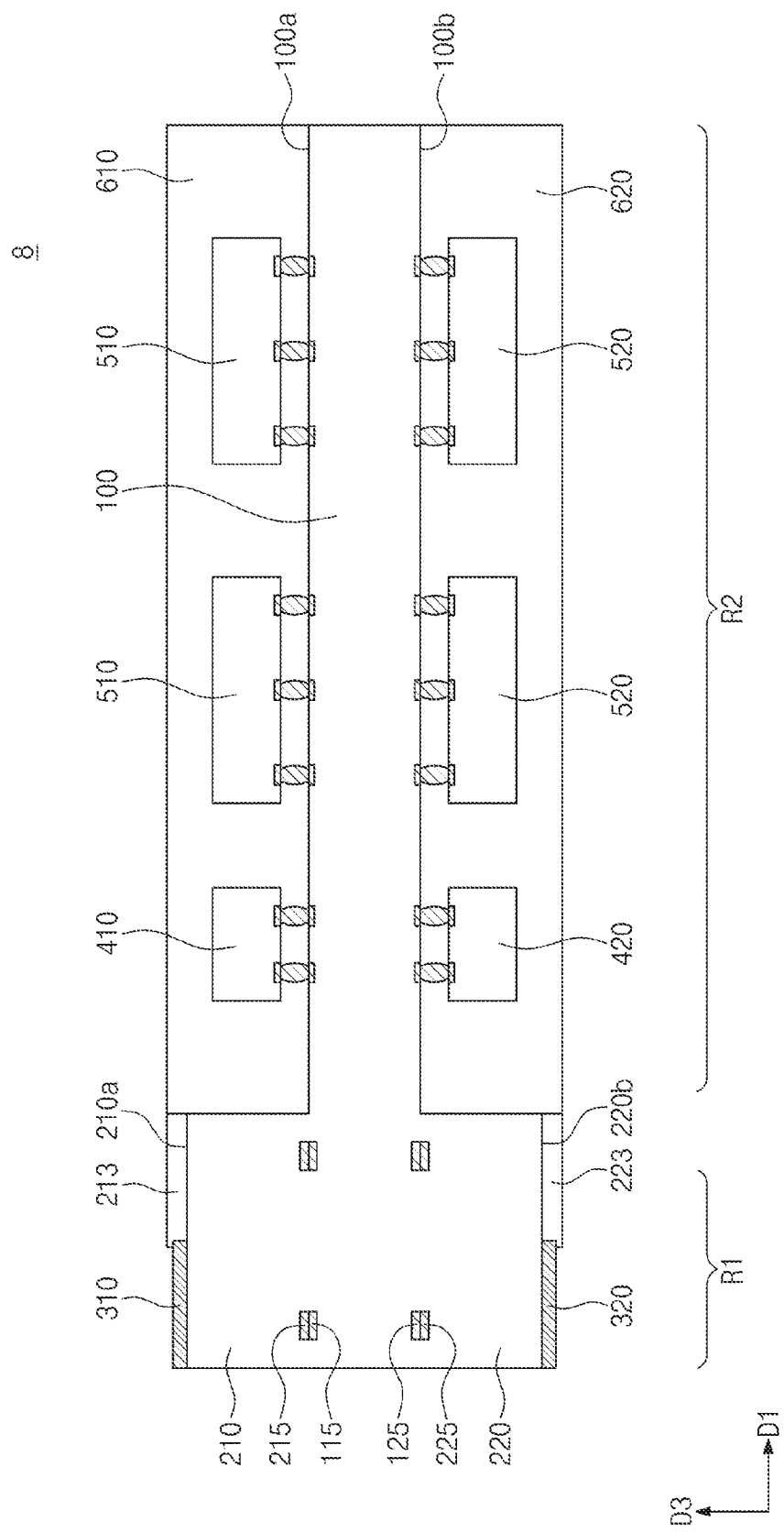

FIGS. 8A, 8B, and 8C are sectional views illustrating a process of forming a semiconductor module, according to an embodiment of the inventive concepts. A previously described element may be identified by an identical reference number without repeating an overlapping description thereof, for the sake of brevity.

Referring to FIG. 8A, the first substrate 210 and the module substrate 100 may be prepared. For example, the first substrate 210 and the module substrate 100 may be formed of or include a semiconductor material (e.g., silicon). The first substrate 210 may be disposed on the first region R1 of the module substrate 100 in such a way that the first pad 215 of the first substrate 210 is aligned to the upper pad 115 of the module substrate 100. Before the disposition of the first substrate 210, a plasma etching process and a treatment process using a chemical solution may be performed on the bottom surface 210b of the first substrate 210 and the first region R1 of the first surface 100a of the module substrate 100. The plasma etching process may be performed using at least one of oxygen, argon, nitrogen, $CF_4$, or $NH_3$. The treatment process may be performed using ammonium hydroxide, $NH_4F$, or HF as the chemical solution. The plasma etching process and the treatment process may be performed to form activated functional groups on the bottom surface 210b of the first substrate 210 and the first surface 100a of the first region R1 of the module substrate 100. The activated functional groups may be Si—$NH_2$ or Si—F.

Referring to FIG. 8B, the first substrate 210 may be directly bonded on the module substrate 100. For example, the activated functional group on the bottom surface 210b of the first substrate 210 may react with activated functional group on the first surface 100a of the module substrate 100, and as a result, the first substrate 210 may be attached to the module substrate 100. The first pad 215 may be coupled to the upper pad 115, and thus, the first substrate 210 may be electrically connected to the module substrate 100. The direct bonding of the first substrate 210 may be performed at room temperature (e.g., about 25° C.). As another example, during a process of attaching the first substrate 210 to the module substrate 100, an annealing process may be further performed on the first substrate 210. The annealing process may be performed at a temperature of 200° C. or lower.

Referring to FIG. 8C, the second substrate 220 may be directly bonded on the second surface 100b of the module substrate 100. The second substrate 220 may be formed of or include a semiconductor material (e.g., silicon). The direct bonding of the second substrate 220 may be performed using the same method as that for the first substrate 210 of FIGS. 8A and 8B. The first electronic component 410, the first semiconductor chip 510, and the first mold layer 610, the second electronic component 420, the second semiconductor chip 520, and the second mold layer 620 may be mounted on the module substrate 100. As a result of the above process, a semiconductor module 8 may be manufactured.

Figure 9B:
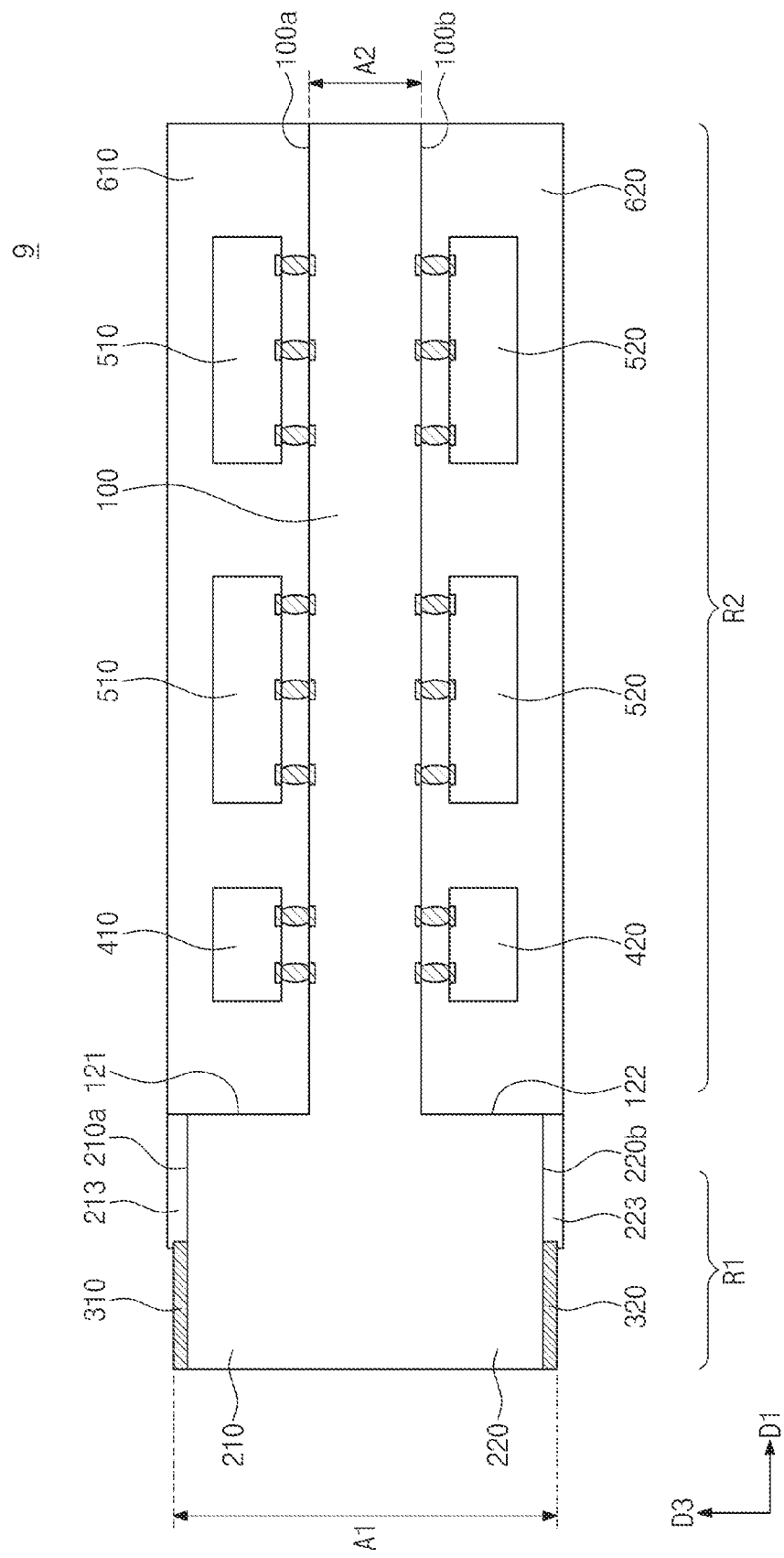

FIGS. 9A and 9B are sectional views illustrating a process of forming a semiconductor module, according to an embodiment of the inventive concepts. For example, each of FIGS. 9A and 9B illustrates a vertical section of the semiconductor module, taken along line I-I' of FIG. 1A. A previously described element may be identified by an identical reference number without repeating an overlapping description thereof, for the sake of brevity.

Referring to FIG. 9A, the module substrate 100 including the first substrate 210 and the second substrate 220 may be manufactured. For example, the module substrate 100 with the first taps 310 and the second taps 320 may be prepared. Here, the module substrate 100 may be a printed circuit board. Thereafter, portions of the module substrate 100 may be removed (e.g., by etching, grinding, etc.) to form a first recess region 121 and a second recess region 122 on top and bottom surfaces, respectively, of the module substrate 100, as depicted by a dotted line. The first recess region 121 may be formed to define the first substrate 210. The first surface 100a of the second region R2 of the module substrate 100 may correspond to a bottom surface of the first recess region 121 and may be positioned at a lower level than that of the top surface 210a of the first substrate 210. The second recess region 122 may be formed to define the second substrate 220. The second surface 100b of the second region R2 of the module substrate 100 may correspond to a bottom surface of the second recess region 122 and may be positioned at a lower level than that of the bottom surface 220b of the second substrate 220. Referring to FIG. 9A in conjunction with FIGS. 1C and 1D, an electric connection between the first and second substrates 210 and 220 and the module substrate 100 may be established in a similar manner to that described with reference to FIG. 1C or FIG. 1D. In certain embodiments, the connecting portions 250 and 260 of FIGS. 1C and 1D may be omitted, and the first and second conductive patterns of the first and second substrates 201 and 220 may be directly coupled to the metal patterns 109 of the module substrate 100.

Referring to FIG. 9B, the first electronic component 410, the first semiconductor chip 510, and the first mold layer 610 may be mounted in the first recess region 121, and the second electronic component 420, the second semiconductor chip 520, and the second mold layer 620 may be mounted in the second recess region 122. The thickness A1 of the first region R1 of the semiconductor module 9 may be greater than the thickness A2 of the second region R2 of the module substrate 100. As a result, a semiconductor module 9 may be manufactured.

According to some embodiments of the inventive concepts, a first region of a semiconductor module may be inserted into an electronic device. A first substrate and a second substrate may be mounted on a first region of a module substrate. The first and second substrates may be provided to allow a thickness of the first region of the semiconductor module to be within a range meeting the standard for a thickness of the semiconductor module. A thickness of the second region of the module substrate may be smaller than a thickness of the first region of the semiconductor module. Semiconductor chips may be mounted on the second region of the module substrate. Accordingly, it is possible to reduce a size of a semiconductor package.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor module, comprising:
a module substrate including at least one first chip on a first surface of the module substrate and at least one second chip on a second surface of the module substrate, the second surface being opposite to the first surface;
a first substrate mounted on and electrically connected to the first surface of the module substrate, the first substrate having one or more first electrical connectors, the one or more first electrical connectors electrically connecting the first substrate to the at least one first chip via the module substrate; and
a second substrate mounted on and electrically connected to the second surface of the module substrate, the second substrate having one or more second electrical connectors, the one or more second electrical connectors electrically connecting the second substrate to the at least one second chip via the module substrate.

2. The semiconductor module of claim 1, wherein the module substrate has a first region and a second region, and the first substrate is mounted on the module substrate in the first region.

3. The semiconductor module of claim 2, wherein an edge of the first substrate is aligned with an edge of the module substrate.

4. The semiconductor module of claim 3, wherein the first electrical connector is a tap extending on an outer surface of the first substrate perpendicularly from the edge of the first substrate.

5. The semiconductor module of claim 4, wherein the first substrate includes a plurality of taps arranged in column along the edge of the first substrate.

6. The semiconductor module of claim 5, further comprising:
a mold layer over the first surface of the module substrate and partially covering the first substrate such that the plurality of taps remain exposed.

7. The semiconductor module of claim 2, wherein the first electrical connector is a tap extending on an outer surface of the first substrate perpendicularly from an edge of the first substrate.

8. The semiconductor module of claim 2, wherein an outer surface of the first substrate is at a different level than the first surface of the module substrate in the second region.

9. The semiconductor module of claim 2, wherein a thickness of the semiconductor module at the first region meets a thickness requirement for a standardized connector.

10. The semiconductor module of claim 2, further comprising:
    at least one chip mounted to the module substrate in the second region.

11. The semiconductor module of claim 2, further comprising:
    at least one package mounted to the module substrate in the second region.

12. The semiconductor module of claim 1, wherein at least one solder ball electrically connects the first substrate to the module substrate.

13. A semiconductor module, comprising:
    a main substrate; and
    a connection substrate and at least one chip mounted on a first surface of the main substrate, and the connection substrate including one or more taps for electrically connecting the semiconductor module to an external device,
    wherein the at least one chip does not overlap the taps in a plan view, and
    the at least one chip is electrically connected to at least one of the taps through the main substrate and the connection substrate.

14. A system, comprising:
    a module substrate having a connecting region and a system region, the module substrate having a first surface and a second surface, the second surface being opposite the first surface;
    a first substrate mounted on and electrically connected to the first surface of the module substrate in the connecting region, the first substrate having one or more first electrical connectors, the first substrate electrically connecting the first electrical connector to the module substrate;
    at least one first system structure mounted on the first surface of the module substrate in the system region;
    a second substrate mounted on and electrically connected to the second surface of the module substrate in the connecting region, the second substrate having one or more second electrical connectors, the second substrate electrically connecting the second electrical connector to the module substrate; and
    at least one second system structure mounted on the second surface of the module substrate in the system region.

15. The system of claim 14, wherein the first system structure is a chip.

16. The system of claim 14, wherein the first system structure is a package.

17. The system of claim 14, wherein the first system structure is a one of a chip and a package, and the second system structure is one of a chip and a package.

18. The system of claim 14, wherein the system is a solid state drive.

19. The system of claim 14, wherein an outer surface of the first substrate is at a different level than the first surface of the module substrate in the system region, and an outer surface of the second substrate is at another different level than the second surface of the module substrate in the system region.

* * * * *